(12) United States Patent
Watanabe et al.

(10) Patent No.: US 6,373,671 B1
(45) Date of Patent: Apr. 16, 2002

(54) APPARATUS WITH AN OVER-CURRENT SHUTDOWN MEANS AND AN OVER-TEMPERATURE SHUTDOWN MEANS

(75) Inventors: Mitsuhiko Watanabe, Odawara; Katsuya Oyama, Hitachinaka; Shoji Sasaki, Hitachinaka; Toshio Hayashibara, Hitachinaka; Kaneyuki Okamoto, Hitachinaka; Ichiro Ohsaka, Kawasaki, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/419,283

(22) Filed: Oct. 15, 1999

(30) Foreign Application Priority Data

Oct. 16, 1998 (JP) .......................................... 10-294902

(51) Int. Cl.$^7$ ................................................. H02H 3/00
(52) U.S. Cl. ........................ 361/93.8; 361/103; 361/78; 361/87
(58) Field of Search ............................... 361/78–79, 86, 361/87, 93.1, 93.4, 93.8, 103; 307/11, 39

(56) References Cited

U.S. PATENT DOCUMENTS 5,642,252 A * 6/1997 Sakamoto et al. ......... 361/93.9
5,898,557 A * 4/1999 Baba et al. .................. 361/103
5,994,790 A * 11/1999 Nagashima et al. ....... 307/10.1

FOREIGN PATENT DOCUMENTS

| JP | 61-261920 | 11/1986 |
| JP | 62-11916 | 1/1987 |
| JP | 62-143450 | 6/1987 |
| JP | 63-87128 | 4/1988 |

* cited by examiner

Primary Examiner—Michael J. Sherry
(74) Attorney, Agent, or Firm—Crowell & Moring LLP

(57) ABSTRACT

A control apparatus for controlling multiple power loads in a vehicle includes a circuit for detecting a current abnormality of a power element and a circuit for monitoring a temperature abnormality in a locality of the power element. Circuits are also provided continuing or shutting down the power element based on information concerning the above stated current and/or temperature abnormalities, with a timing which is established according to a substantially constant period or a time interval which is stored in advance in a memory element.

16 Claims, 16 Drawing Sheets they cannot control the system to shut down automatically and to return suitably by sensing an abnormality in the element which controls the continuity and shutdown of the current to the plural loads. Further, in a shutdown method for detecting an abnormality of the current or of the temperature in each individual load, the circuit construction becomes complicated and expensive.

APPARATUS WITH AN OVER-CURRENT SHUTDOWN MEANS AND AN OVER-TEMPERATURE SHUTDOWN MEANS

BACKGROUND OF THE INVENTION

The present invention relates to a control apparatus for controlling plural power loads in a vehicle and in particular to an apparatus with over-current and over-temperature shutdown means that are safe and inexpensive, and that effectively protect an integrated circuit in which an abnormality over-current can flow in response to a load short-circuit etc.

According to a technique which is commonly employed in conventional systems, the current supplied to a load is detected, and when the current becomes too large, it is shut down automatically. This system has been used, for example, in connection with MOSFET (Metal Oxide Semiconductor Field Effect Transistor), as disclosed in, for example, Japanese application patent laid-open publication No. Sho 61261920, Japanese application patent laid-open publication No. Sho 62-11916, Japanese application patent laid-open publication No. Sho 62-143450, and Japanese application patent laid-open publication No. Sho 63-87128, etc.

However, these current detection systems become problematic on occasion. For example, where the load is a head lamp etc. in an automobile, switching from an off condition to a light-on condition, elimination of a momentary large current interferes with smooth lighting of the lamp. That is, it results in a noticeable delay until the light comes on under a necessary timing and the lighting is thus obstructed. In other words, it is necessary and indispensable to have an abrupt current during this regular use condition.

For this reason, in a technique shown in Japanese patent application No. Hei 8-303018, monitoring the temperature but not current permits a short-circuit of the load and a momentary current at the regular load, and further during an abnormality short-circuit accident and an operation in which it is shut down automatically.

However the above described technique presents a further problem which is unavoidable when plural loads are controlled by a single chip integrated circuit. In the case of the employment of an over-current abnormality detection system, each over-current abnormality automatically shuts down the circuit, which does not reset automatically. Thus, this system is vulnerable to a malfunction caused by noises. That is, when a large current surge momentarily and suddenly shuts down the system, and the system is not reset, the convenience of the system is diminished.

After switching from the abnormal condition to the shutdown condition, and the abnormality detection current is lowered, the system returns to the continuity condition. In this case the current can be limited to some degree. However, when the load short-circuit is generated repeatedly, semi-continuity is continued, and a rise in temperature and deterioration of the element are likely.

Further, the system for detecting over-temperature cannot specify which element on the same chip is causing the heat generation and the abnormal temperature. Further, when scattering in the circuit for realizing the temperature detection is not neglected, and when an improvement of accuracy is devised, such an apparatus must be a very high cost apparatus.

As stated above, in the power element having only a single protection function according to the temperature or the current, it is impossible to control the system to shut down automatically and to return suitably by sensing an abnormality in the element which controls the continuity and shutdown of the current to the plural loads. Further, in a shutdown method for detecting an abnormality of the current or of the temperature in each individual load, the circuit construction becomes complicated and expensive.

SUMMARY OF THE INVENTION

An object of the present invention is to provide an apparatus with an over-current shutdown device and an over-temperature shutdown device wherein by compatibly combining a current protection function of a power element at a continuity condition with an over-temperature protection function (which has a slower reaction than that of the current protection function but can detect surely the abnormality), the abnormal power element can be specified.

Another object of the present invention is to provide an apparatus with an over-current shutdown device and an over-temperature shutdown device wherein, by compatibly forming a current protection function of a power element at a continuity condition, with an over-temperature protection function (which has a slower reaction than that of the current protection function but can detect surely the abnormality), a simple circuit construction can be realized with a low cost.

These and other objects and advantages are achieved by the control apparatus according to the present invention, which includes means for detecting a current abnormality of a power element, means for monitoring a temperature abnormality of a local area of the power element, and means for continuing or shutting down the power element based on information concerning the above stated current and/or temperature abnormalities with a timing which is established according to a substantially constant period or a time interval which is stored in advance in a memory element etc.

DESCRIPTION OF THE INVENTION

One embodiment of an apparatus with an over-current shutdown means and an over-temperature shutdown means according to the present invention will be explained referring to a block diagram shown in FIG. 1.

Figure 1:
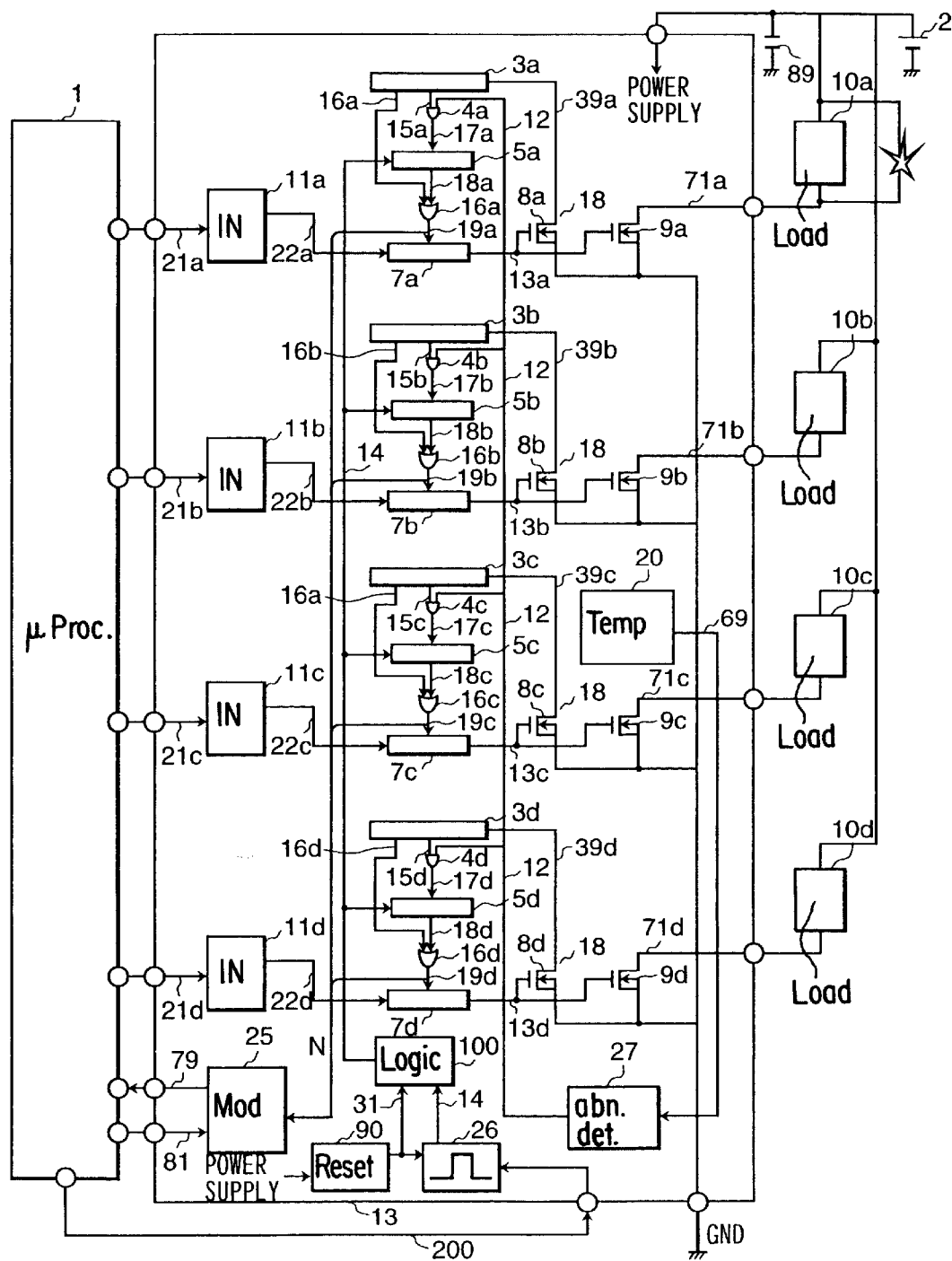
FIG. 1 is a block diagram showing one embodiment of an apparatus with over-current and over-temperature shutdown means according to the present invention.

In FIG. 1, reference numeral 1 is a microprocessor which outputs control signals 21a–21d for controlling loads 10a–10d; reference numeral 2 designates a power supply for supplying an electric power to the loads 10a–10b; and reference numerals 3a–3d mare over-current detection circuits for detecting an abnormality of the current which flows to switch power elements 9a–9d for controlling a continuity and shutdown of the current to the loads 10–10d.

Reference numerals 4a–4d are gate elements which perform a logic product execution between an over-temperature detection signal 12 output from a temperature abnormality detector 27 for detecting a heat generation abnormality of the switch power elements 9a–9d, and over-current detection signals 15a–15d which are output from the above stated over-current detection circuits 3a–3d and further latch set signals 17a–17d are outputted.

Reference numerals 5a–5d are latch circuits which hold a condition; reference numerals 6a–6d are gate signals which perform a logic product execution between latch signals 18a–18d from the latch circuits 5a–5d and over-current limit signals 16a–16d from the over-current detection circuits 3a–3d; reference numerals 7a–7d are shutdown circuits which control gate voltages 23a–23d of the switch power element 9 according to shutdown signals 19a–19d which are outputted from the switch gate element 6.

Reference numerals 8a–8d are semiconductor elements which flow mirror currents 39a–39d having amplitudes substantially equal to a size ratio against the current amount which flows to the switch power element 9; reference numerals 11a–11d are input circuits, and reference numerals 22a–22d are input signals. Further, reference numeral 100 designates a logic circuit which generates latch clear signals 14a–14d that clear the latch circuits 5a–5d to an initial condition according to a reset signal 91 which is generated in a reset generator 90 in response to the power supply voltage and a re-return pulse 14 which is generated in a pulse generator 26.

Further, in the pulse generator 26, an establishment signal 200 for establishing a period of the re-return is input from an outside source (for example, the microprocessor 1) Reference numeral 25 is a communication use modulator, which receives the latch set signal 19 and transmits to the microprocessor 1 a serial communication signal 29. The communication use modulator 25 may be operated by a standard clock signal Bl which is supplied from the microprocessor 1.

Further, a reference numeral 20 is a temperature detector for detecting the temperature rise which is generated when current flows to the switch power element 9, and outputting a temperature detection voltage 69. Reference numeral 13 designates an integrated circuit to which the above stated circuits are integrated on one chip and reference numerals 71a–71d are output terminal voltages of terminals to which the loads 10a–10d are connected.

In FIG. 1, the switch power elements 9a, 9b, 9c and 9d can be constituted by a bipolar transistor, a thyristor etc.; however in this embodiment, as a representative example, the switch power element will be explained using a MOS-FET.

Since the currents 39a–39d (the mirror currents) are flown to the semiconductors 8a–8d with a size ratio (for example 1/100) versus the currents which flow in the switch power elements 9a–9d, the load current can be monitored with very small current.

A resistor can also be inserted in series with the loads and the potential difference across it monitored as a substitute. However in this case since the useless power which is consumed by the resistance is large, as shown in this embodiment according to the present invention, a voltage drop monitor method by forming a branch-flow of a very small current is advantageous from an aspect of the electricity.

In FIG. 1, the similar four circuits are indicated using the suffixes a, b, c and d, however the number of the circuits is not to be limited to four, but may be enlarged to a desired integer number (N).

The above described embodiment of the present invention is constituted by the respective blocks which are shown hereinafter in detailed constructional view, and the desirable improved operation can be realized in most cases according to the processing as summarized hereinafter.

Namely, by showing as a representative example using the circuitry shown in the suffix a, when the load 10a exhibits continuity, first of all the microprocessor 1 outputs the control signal 21a, which is recognized as a signal 22a in an interior portion of an element 13. In an ordinary case, the power switch element 9a is closed (becomes continuous), so that a current having a scheduled current range flows through the load 10a and the power switch element 9a.

However, when an excessive current flows due to an some abnormality (for example, short-circuit in the load 10a), in the element 3a (and the output signal 16a) even when the current limit having some degree is performed, it is assumed that as a current which exceeds the established or fixed value flows as ever, the abnormality detection result signal 15a assumes a high ("HIGH") potential.

The latch circuit 5a is set in accordance with the product (from the element 4a) among the detected abnormality signal 15a and the over-temperature detection signal 12, which is detected by the temperature detector 20 and the temperature abnormality detector 27. A Q output, which is set upon occurrence of the abnormality condition, is transmitted to the shutdown circuit 7a to implement the shutdown condition through the element 19a, shutting down the power element 9a (simultaneously to the semiconductor element 8a).

When this condition is continued, it is impossible to carry out re-return; however the pulse generator 26 generates a signal 14a which becomes the re-return trigger in a suitable interval and tries to clear the latch circuit 5a.

When the set signal of the latch signal 5a is at a low ("LOW") potential, the abnormality condition is released, and the Q output reverts to low ("LOW") potential with the clear signal. Herein, when the input signal 22a is at a high ("HIGH") potential, the switch power element 9a is restored to the continuity condition. With the above construction, the malfunction due to the noises etc. can be separated, and protection can be performed surely.

Next, hereinafter the detailed operation of the respective parts of the apparatus with over-current and over-temperature protection according to this embodiment of the present invention will be explained, referring the detailed construction views and the timing charts using from FIG. 2 to FIG. 11.

Figure 2:
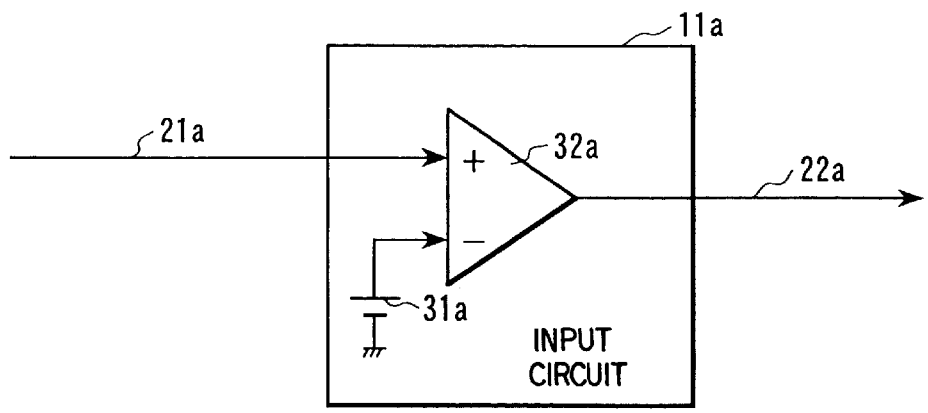
FIG. 2 is a block diagram showing construction of an element of the apparatus shown in FIG. 1.

FIG. 2 shows one example of the input circuits 11a–11d. Reference numeral 31a represents a standard voltage, and reference numeral 32a is a comparator. With the construction described above, the control signal 21a is inputted from the microprocessor 1 and when it exceeds the standard voltage 31a, a high (HIGH) voltage is output to the input signal 22a.

The comparator 32a outputs surely the logic signal strengthening the tolerance of the system against noises on the control signal 21a; and of course it is possible to constitute it by a buffer circuit using the transistors. The signal 22a is input to a gate terminal of the switch power element 9a through the shutdown circuit 7a.

Next, referring to FIG. 3, the shutdown circuits 7a–7d will be explained. In the shutdown circuit 7a, the switch is changed over based on the shutdown signal 19a. In the ordinary condition (19a: "LOW"), since the switch is connected to terminal 60a, the gate voltage 23a is changed based on the input signal 22a.

That is, as stated hereinafter, and in FIG. 8, the input voltage 22a becomes "HIGH", the gate voltage 23a becomes "HIGH", the switch power element 9a assumes an "ON" condition, and as a result the current flows to the load 10a from the power supply 2.

Further, the over-current detection circuits 3a–3d will be explained simply referring to FIG. 4, in which reference numerals 33a and 35a are comparators; reference numerals 34a and 36a are constant voltage sources for outputting constant voltage signals 41a, 42a; reference numerals 37a and 38a are inverters (reversers); reference numeral 43a is a resistor (element); and reference numeral 39a is a current signal, which shows a current which flows to a semiconductor element (for example, MOSFET).

Herein, it is assumed that the regular load current is 100 mA; that a size ratio between currents of the element 9a and the element 8a is 100:1; that the current 39a which is obtained by branch flowing as stated in above is normally 1 mA; and that the resistance value of the resistor 43a is 0.2K.

In the regular load current, since the current 39a is 1 mA, the voltage drop of the resistor 39a is 0.2 V. Herein, when an attempt is made to limit the maximum current which flows in the load to 10 times (that is, to limit the maximum current to 1 A), it is necessary to detect a voltage drop of 2 V of the resistor 43a.

When the power supply voltage is assumed as 12 V, the voltage 41a is set to 10 V, it can obtain the signal which becomes "HIGH" at more than the maximum limit current. The reason why the voltage 40a is approximately 10 V at 10 times the regular current, and is less than 10 V at more than the 10 times of the regular current, is that the voltage 40 is the drop voltage which is caused by the resistor 43a and has a value of (power supply voltage)—(the resistor 43a×the current 39a).

Similarly, it is established that the voltage 42a is 11 V. When a current having a magnitude about 5 times the regular current flows, the voltage signal 40a becomes approximately 11 V, and when a current greater than stated above flows, the voltage signal 40a becomes lower than 11 V. As a result, the "HIGH" potential is provided to the signal 15a.

When a suitable resistor is inserted between the points 45 and 46 of this embodiment of the invention, it is possible to combine the potential of the voltage power supplies 34a and 36a.

Figure 12:
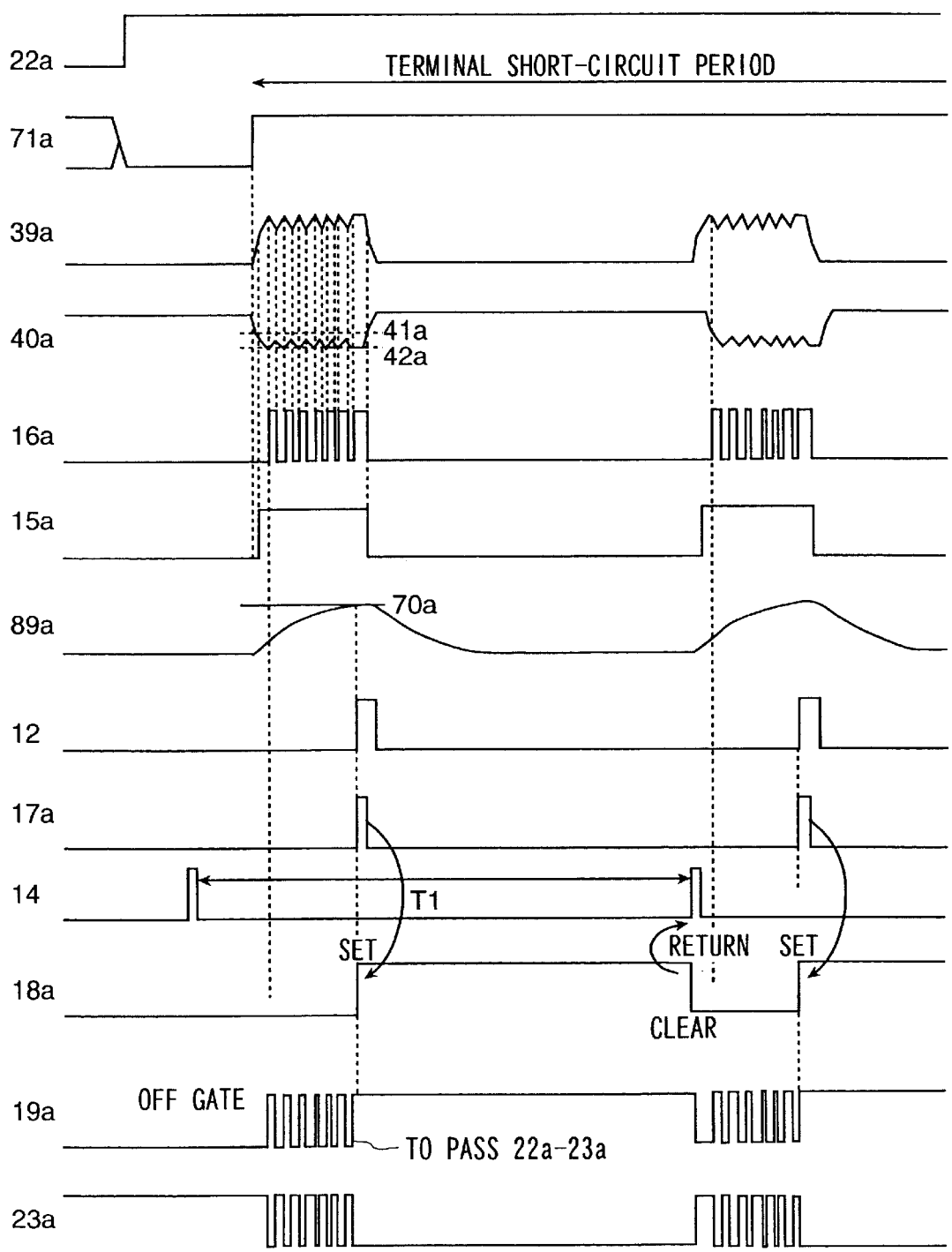
FIG. 12 illustrates additional waveforms of the apparatus shown in FIG. 1.

Next, in this condition, as shown in FIG. 1 and FIG. 12, load 10a is short-circuited, and when the short-circuit occurs, the following operation will be carried out. Since the load is short-circuited, and since the switch power element 9a is in an "ON" state, a very large current flows to the switch power element 9a in comparison with the normal condition.

At this time, since the switch power element 9a and the semiconductor element 8a have the circuitry construction as shown in FIG. 1, based on the short-circuit, a mirror current 39a having an amount which is substantially proportional to the current flowing the switch power element 9a flows to the semiconductor element 8a.

As stated in above, since the short-circuit is present, a very large current flows immediately through the switch power element 9a, and as shown in FIG. 12 the mirror current 39 becomes large in response to the above stated very large current. Accordingly, the voltage drop becomes large, and the drop voltage 40a which is inputted to the comparators 33a and 35a decreases.

Figure 4:
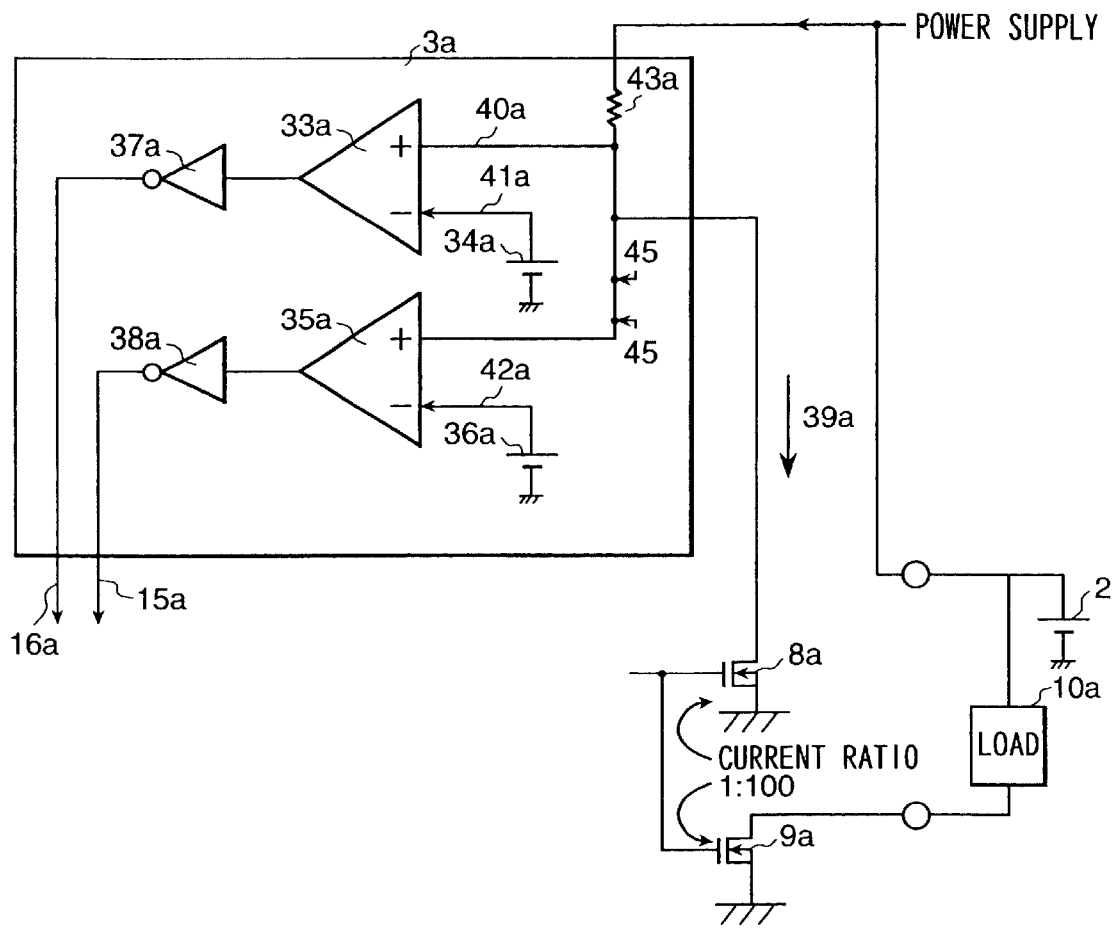
FIG. 4 is a block diagram showing the construction of a further element of the apparatus shown in FIG. 1.

As a result, when the drop voltage 49a exceeds the threshold value voltages 41a and 42a which are established in the respective comparators 33a and 35a, as shown in FIGS. 4 and 12, the over-current limit signal 16a and the over-current detection signal 15a are outputted.

Among them, the over-current limit signal 16a which is outputted from the over-current detection circuit 3a is inputted to the shutdown circuit through OR gate 6a.

Figure 3:
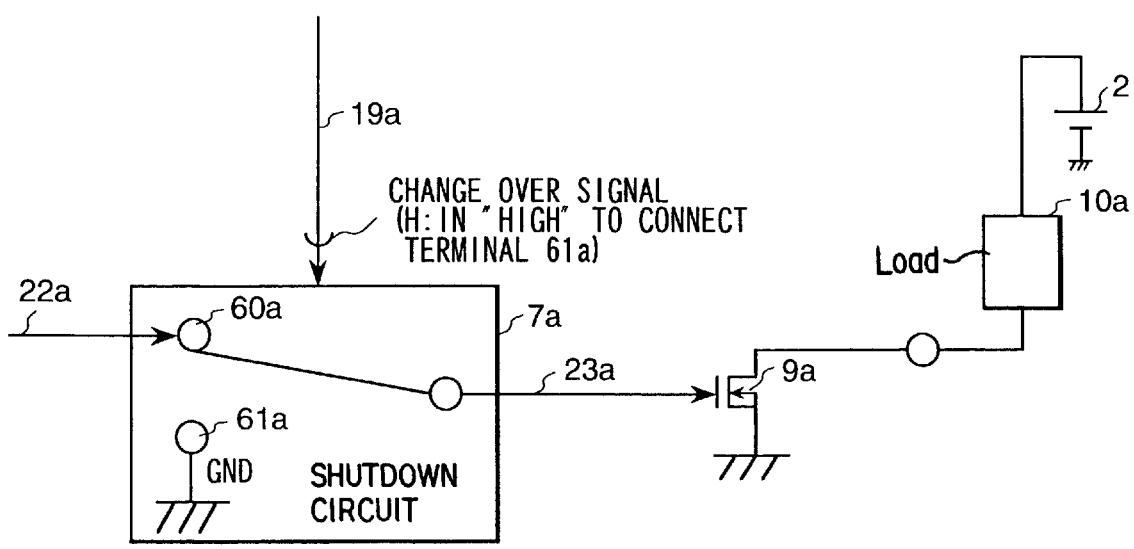
FIG. 3 is a block diagram showing the construction of another element of the apparatus shown in FIG. 1.

The shutdown circuit 7a has the construction shown in FIG. 3 as described above. When the over-current limit signal 16a is inputted through the OR gate 6a, the shutdown signal becomes "HIGH", and the switch power element 9a is changed over to a side of the terminal 61a.

Accordingly, since the gate voltage 23 which has been "HIGH" becomes "LOW", the switch power element 9a turns "OFF" so that it is possible to prevent a flow of current greater than above, and destruction of the switch power element 9a.

Figure 5:
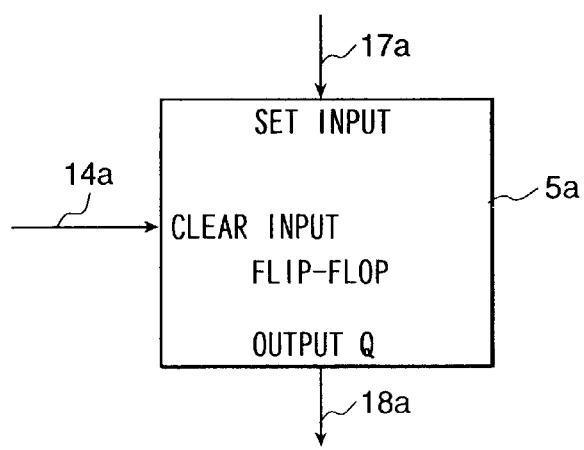
FIG. 5 is a block diagram showing the construction of another element of the apparatus shown in FIG. 1.

Next, the latch circuits 5a–5d will be explained referring to FIG. 5. The latch circuits 5a–5d have set input terminals and clear terminals. According to the latch set signal 17*a* the latch is set, and the latch signal 18*a* is generated at the Q output. Further, the latch clear signals 14*a*–14*d* clear the latch circuits to zero, and it is reset to the initial condition (the Q output: "LOW").

As a result, when a short-circuit of the load as stated above is presented, the over-current detection circuit 3*a* detects the current abnormality and the over-current detection signal 15*a* is outputted. Simultaneously with the output of the over-temperature detection signal 12 (stated in a latter portion), according to "AND" of these two signals the latch set signal 17*a* is outputted, and the latch is set, and the Q output "HIGH" is outputted.

Further, the latch circuits 5*a*–5*d*, which have been set as stated above, are cleared automatically in accordance with the input of the latch clear signal 14*a* which is generated in the logic circuit 100 and is self-returned to the initial condition (the Q output: "LOW").

Next, the temperature detector 20 shown in FIG. 6 will be explained in detail. When the load is short-circuited, as stated above a very large current flows through the switch power element 9*a*. As also stated above, according to the over-current limit signal lGa the current does not exceed a predetermined amount.

Figure 8:
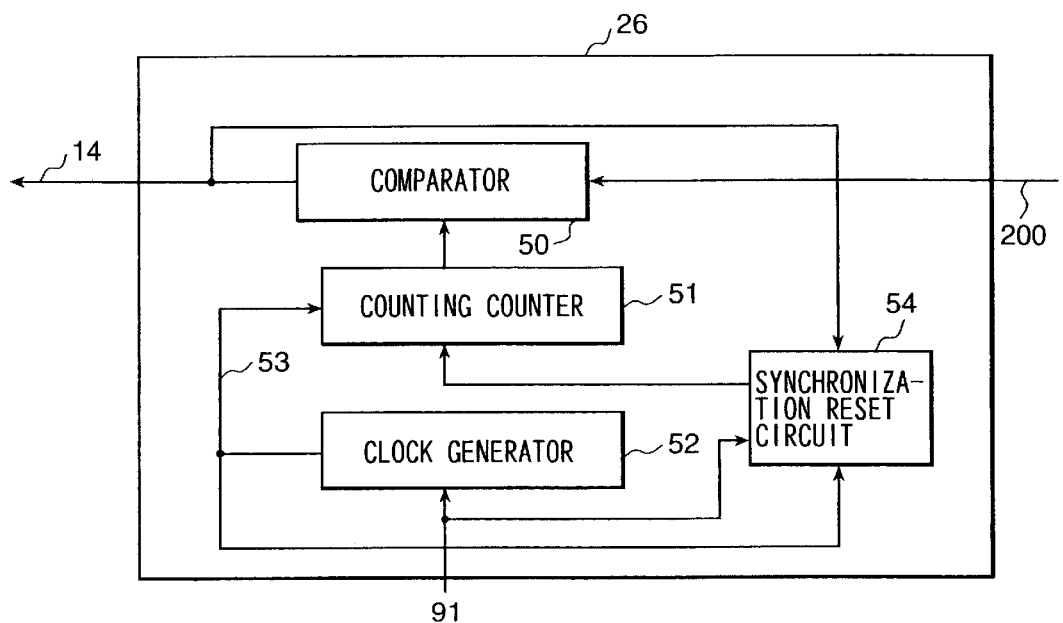
FIG. 8 is a block diagram showing the construction of yet another element of the apparatus shown in FIG. 1.

However in the over-current limit signal 16*a* shown in FIG. 4, since the gate voltage 23*a* is merely changed over to "LOW" (so to avoid a flow of current greater than the predetermined amount), thereafter, when the current amount is decreased, as shown in a reference numeral 39*a* in FIG. 8, the over-current flows again. As a result, during a period when the input signal 22*a* is "HIGH", the over-current flows continuously.

In this case, since the switch power element 9*a* is a semiconductor (for example, MOS-FET), even "ON" time there little resistance ("ON" resistance).

As a result, in contrast to the normal condition, as in the case where the above stated short-circuit is presented when the large current is flown, the switch power element 9*a* generates heat according to its "ON" resistance.

Further, in the embodiment according to the present invention, as shown in FIG. 1, since the circuit is integrated on one chip, the heat generation of the switch power element 9*a* in the above stated short-circuit condition is transferred to the chip circuit 13, and to the temperature detector 20.

The temperature detector 20 and the temperature abnormality detector 27 perform the following operations.

Figure 6:
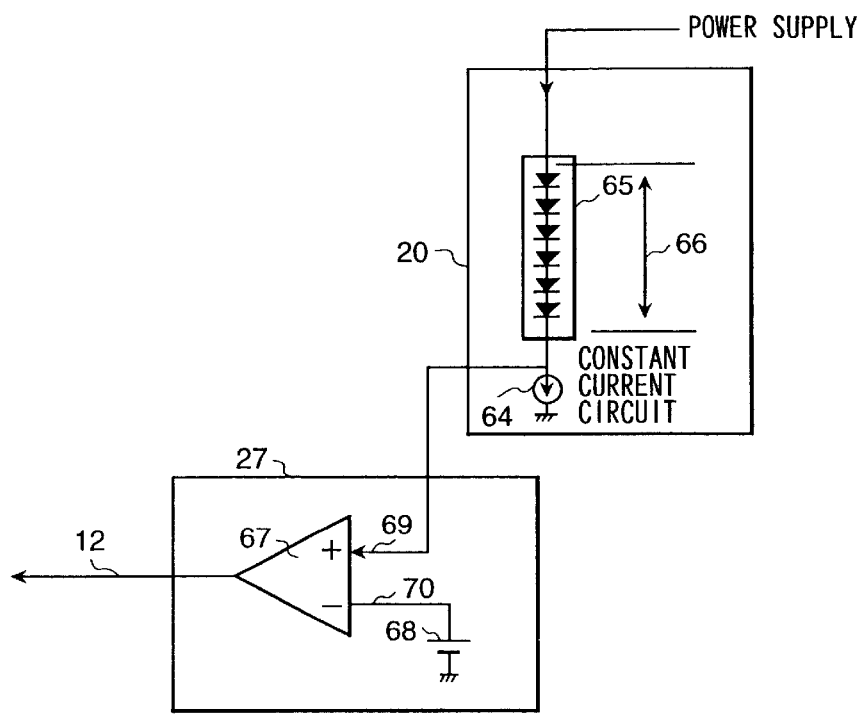
FIG. 6 is a block diagram showing the construction of still another element of the apparatus shown in FIG. 1.

FIG. 6 shows one example of a circuit of the temperature detector 20 and the temperature abnormality detector 27.

In FIG. 6, reference numeral 64 is a constant current circuit, reference numeral 65 is a diode, and reference numeral 66 is a forward direction voltage (a diffusion voltage) of all of the transistors. Further, reference numeral 67 is a comparator, reference numeral 68 is a standard power supply, reference numeral 70 is a temperature threshold value voltage which is a comparison standard of the comparator 67, and reference numeral 69 is a temperature detection voltage which is generated by the temperature fluctuation of the diode diffusion voltage 66.

When the load is short-circuited so that an over-current flows and the switch power element 9*a* generates heat, this heat is transferred to the vicinity of the diode 65 which is constituted on the same chip; thus the temperature of the vicinity of the diode 65 rises. Since the diffusion voltage 66 of the diode 65 drops when the temperature rises, the temperature detection voltage 69 which is input to the comparator 57 rises according to the formula (power supply voltage)13 (diffusion voltage 66) accompanying with the temperature rise. When this temperature detection voltage 69 exceeds the temperature threshold value voltage 70, then the over-temperature detection signal 12 is outputted.

As stated above, when the load is short-circuited, and a large current flows in the switch power element 9*a*, in accordance with the respective detection signals which are generated through the over-current detection circuit 3*a*, the temperature detection detector 20 and the temperature abnormality detector 27, then the latch circuit 5*a* is set and then the latch signal is outputted. As a result, according to the shutdown circuit 7*a* the gate voltage 23*a* of the switch power element 9*a* (and the semiconductor element 8*a*) becomes "LOW".

Next, the logic circuit 100, the reset generator 90 and the pulse generator 26 will be explained in detail.

Figure 7:
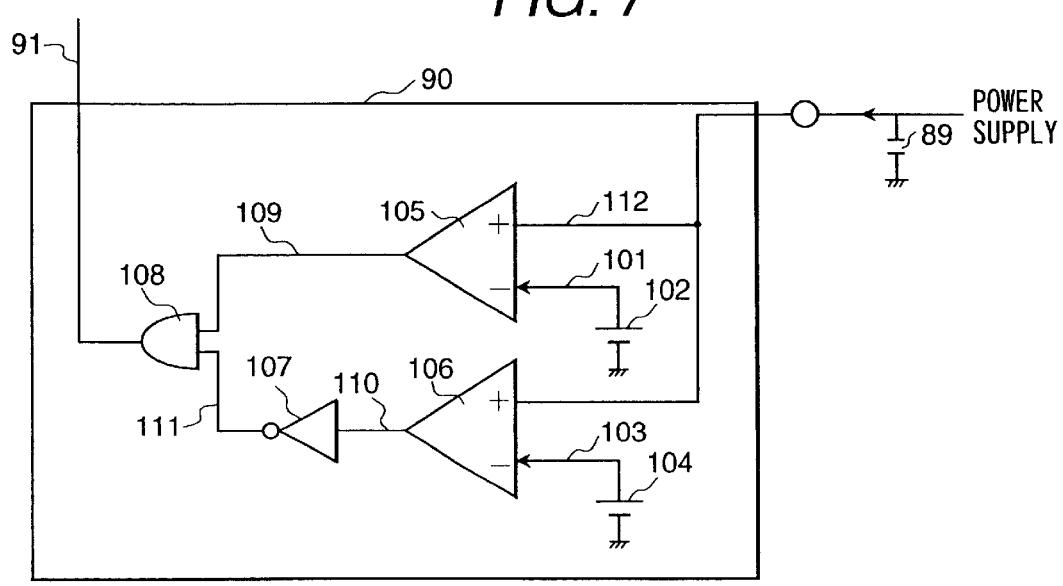
FIG. 7 is a block diagram showing the construction of another element of the apparatus shown in FIG. 1.

FIG. 7 is an example of the circuitry which shows the details of the reset circuit 90. In FIG. 7, reference numeral 112 is a power supply voltage, and reference numeral 101 is a standard voltage provided by power supply 102 as a comparison standard of a comparator 105. Reference numeral 103 is a standard voltage which is a comparison standard of a comparator 106, and reference numeral 104 is a power supply which generates this standard voltage 103.

Reference numeral 109 and 110 are comparison output voltages which are output from the comparators 105 and 106, reference numeral 107 is a reversal buffer, and reference numeral 111 is a reversal output of the comparison output voltage 110. A reference numeral 108 is an "AND" gate which performs an "AND" function from the comparison outputs 109 and 111 from the respective comparators 105 and 106, and then the reset output 91 is outputted.

FIG. 8 shows an example of the circuitry of the pulse generator 26. In FIG. 8, reference numeral 52 is a clock generation circuit, reference numeral 53 is a clock signal which is generated in the clock generation circuit 52, reference numeral 51 is a calculation counter, and reference numeral 200 is an establishment signal which is received from an external component. In the comparator 50, an output of the calculation counter 51 is compared with an establishment value provided by the establishment signal 200.

When the value from the calculation counter 51 agrees with the establishment value, a pulse is output to the synchronization reset circuit 54 and the value in the calculation counter 51 is synchronization reset. As a result, the re-return pulse 14, which is output every predetermined period T1, is generated.

Figure 9:
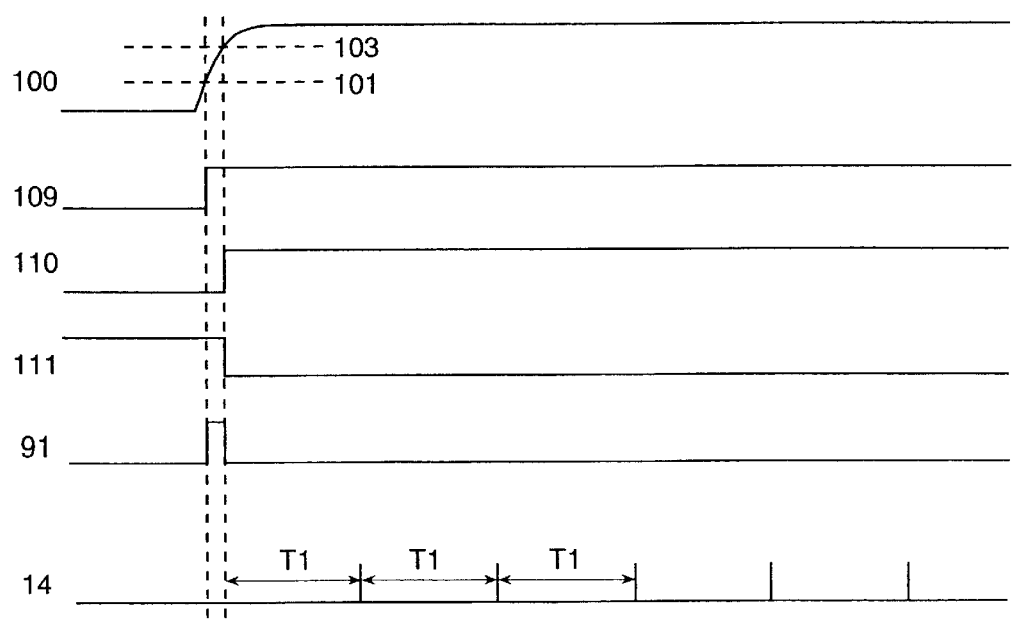
FIG. 9 illustrates waveforms for explaining the operation of the elements shown in FIG. 7 and FIG. 8.

FIG. 9 is a timing chart in which the operations of the above stated reset generator 20 and the above stated pulse generator 26 are explained.

When the power supply rises, the power supply voltage 10 rises gradually, and exceeds the respective standard voltages 101 and 103. As a result, signals 109 and 110 (actually, the reversal output shown with a reference numeral 111) are outputted, and the reset output 91 is outputted as a logical "AND" combination of these two signals 109 and 110 (or 111).

Further, the reset output 91 also causes the calculation counter 52 to be reset, and as a result the re-return pulse 14 (FIG. 9) is output at the predetermined period T1. Further, according to the establishment signal 200, it is possible to establish the comparison standard value of the comparator; in response to the width of the predetermined period T1 it is possible to vary to the suitable period.

Figure 10:
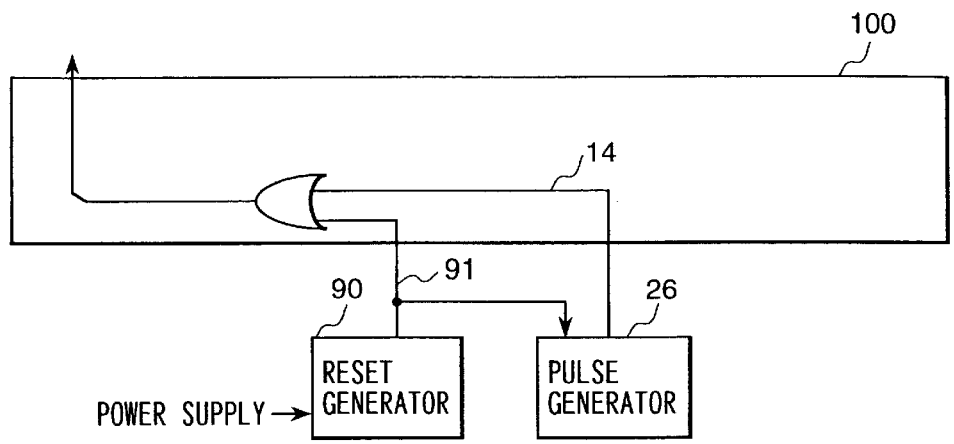
FIG. 10 is a block diagram showing the construction of another element of the apparatus shown in FIG. 1.

FIG. 10 shows an example of the logic circuit 100. The re-return pulse 14 is output from the pulse generator 26, the reset output 91 from the reset generator is presented to the OR gate, and the latch clear signal is the output. As a result, in the latch circuit 5, when the power supply has increased, the latch circuit 5 is reset always; accordingly the latch circuit 5 can be returned to the initial condition.

Figure 11:
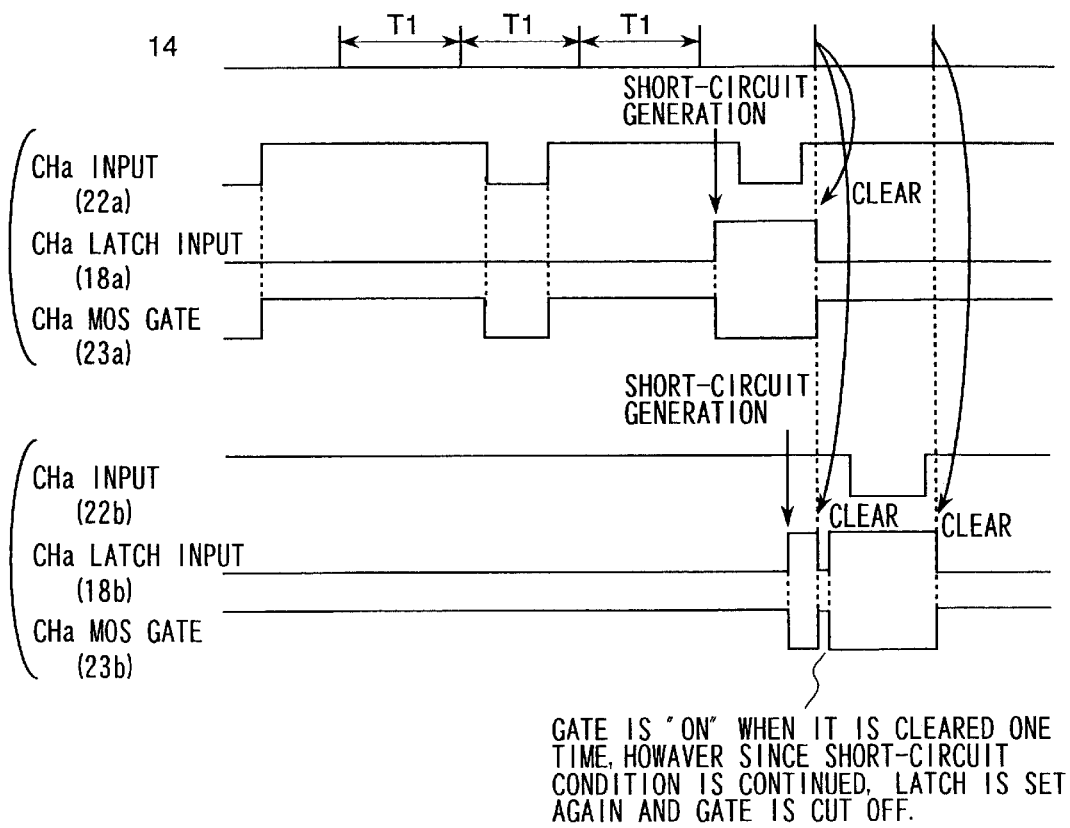
FIG. 11 illustrates waveforms generated by the apparatus shown in FIG. 1.

FIG. 11 is a timing chart which illustrates the setting of the latch circuit 5 as stated above, and the clearing operation according to the re-return signal 14.

In FIG. 11, reference numerals CHa and CHb show one of the respective channels shown in a–d in FIG. 1. In the ordinary condition, when "HIGH" is input to CHa, the MOS gate voltage of Cha becomes "HIGH", and when "LOW" is inputted to CHa, the MOS gate voltage of CHa becomes "LOW".

When a short-circuit occurs, according to the above described operation, a over-current and an over-temperature are detected. The Q output of the latch circuit 5 is set to "HIGH" and according to the shutdown circuit 7 the gate voltage 23 of MOS becomes "LOW". As a result, since the flow of current to the switch power element is interrupted, after a sufficient time is lapsed both the current and the temperature are returned to the regular condition.

After that, the re-return pulse 14 is output at predetermined intervals T1 after the latch is cleared. When the cause of the short-circuit has been removed at the time when the latch is cleared, the MOS gate of CHa becomes "HIGH".

On the other hand, as CHb, when the short-circuit is generated near the time when the re-return pulse 14 is inputted, the Q output of the latch circuit 5 is set to "HIGH" and the gate voltage 23 of MOS becomes "LOW", the time for clearing of the latch by the re-return pulse 14 becomes short.

In this case, the time for returning the current or the temperature to the regular condition is insufficient; and even when the latch is cleared the abnormality condition continues. Accordingly, the latch is set again and the gate voltage is "LOW".

Thereafter, according to the re-return pulse 14 which is outputted at predetermined intervals T1 after the latch is cleared, when the current and the temperature return to a normal condition, after the clear operation the MOS gate voltage becomes "HIGH" in response to the input of CHb.

As a result, even when the load is short-circuited such that an abnormality exists, and the Q output of the latch circuit 5 is set to "HIGH", following the resolution of the abnormality (the load short-circuit), after the lapse of the predetermined period T1, the latch circuit 5 is cleared and is caused to re-return automatically to the initial condition. As a result, it is possible for the gate voltage 23 to be controlled according to the input signal 22.

The entire operation and effect according to the respective blocks explained above is illustrated by the timing chart shown in FIG. 12.

First, the control signal is input from the microprocessor 1. When the input signal 22a becomes "HIGH", the switch power element 9a turns "ON" so that current flows to the load, and the output terminal voltage 71a is "LOW". In this case, the normal condition exists in the mirror current 39 and the temperature detection voltage are in the normal condition.

When the load 10a is subjected to a short-circuit condition, as shown in figure, the output terminal voltage 71a changes to "HIGH", a large current flows to the switch power element 9a and at the same time the mirror current 30a (which is proportional to such current) is increased as shown in a reference numeral 39a in FIG. 12. Accordingly, the voltage drop is generated by the resistor 43a (FIG. 4) in the over-current detection circuit 3a, and the voltage drop 40a varies as shown.

When the voltage drop 40a exceeds the over-current detection threshold value 41a shown in figure, the over-current detection signal 15a is output. Moreover, when the current increases further, the voltage drop 40a becomes larger; and when it exceeds the current limit threshold value 42a, the current limit signal 16a is outputted. The current limit signal 16a alone is inputted to the shutdown circuit through the OR gate 6a, and the gate voltage 23a is becomes "LOW", the switch power element 9a and the semiconductor element 8a are turned "OFF".

With this construction, the current (which has continued to increase to some degree) starts to decrease. However, when it decreases by a predetermined amount, the voltage drop 40a exceeds the current limit threshold value 42a, the current limit signal 16a is changed to "LOW", but the gate voltage 23 is "HIGH".

Accordingly, the switch power element 9a and the semiconductor element 8a are turned "ON", and the current starts to increase. Since the above stated operation sequence is carried out repeatedly, the current flowing in the switch power element 9a does not exceed the predetermined amount, thereby preventing the over-current from destroying the switch power element.

As stated above, when the switch power element 9a is cycled "ON" and "OFF" and the over-current flow continues, the switch power element 9a generates heat due to its "ON" resistance. When this heat is detected by the temperature detector 20, the temperature detection voltage 89a is changed as shown in figure. When the temperature detection voltage 89a exceeds the temperature detection threshold value 70a, the over-temperature detection signal 12 is output.

Based on a logical "AND" combination of the over-temperature detection signal 12 and the over-current detection signal 15a, the latch set signal 17 is output, and the Q output 18a of the latch circuit 5 is set to "HIGH".

Since this latch circuit output 18a is input to the shutdown circuit 7a through the OR gate and the gate voltage 23a is "LOW", the switch power element 9a is turned "OFF", the over-current condition is resolved and the current and the temperature can be returned to the normal condition.

After that, the re-return pulse 14 which is output at predetermined intervals T1 causes the latch circuit 5 to be cleared and returned to its initial condition. (See 18a.) In the example shown in FIG. 12, the short-circuit condition continues, and the above stated operations are carried out repeatedly.

As stated above, according to the construction of the present invention, when plural loads are controlled by a circuit which is constituted on one chip, since over-current detection and the over-temperature detection are used together, an abnormality of the switch power element is detected surely and destruction of the switch power element can be prevented.

Further, even when an abnormality has occurred and the switch power element is interrupted, since this condition can be held at a predetermined time, destruction of the switch power element due to the repetition of "ON" and "OFF" of the switch power element when the abnormality condition and the normal condition are repeated, can be prevented, further after the abnormality condition is resolved. Since this condition is returned to the initial condition in response to the re-return pulse, automatic shutdown and return of the switch power element can be realized with a simple circuit construction.

Further, in the over-current detection circuit, since two kinds of the threshold values (the over-current detection threshold value and the current limit threshold value) are provided, after the over-current detection and the over-temperature detection are carried out, the current which flows while the latch circuit is set to "HIGH" and the switch power element is shut down is limited; as a result destruction of the switch power element can be prevented.

Further, since the latch circuit is set and the switch power element is turned "OFF" only when the over-current and the over-temperature are generated at the same time, a malfunction in the form of a momentary over-current due to noise can be detected.

A second embodiment of an apparatus with an over-current shutdown means and an over-temperature shutdown means according to the present invention will be explained referring to a block diagram of FIG. 13.

Figure 13:
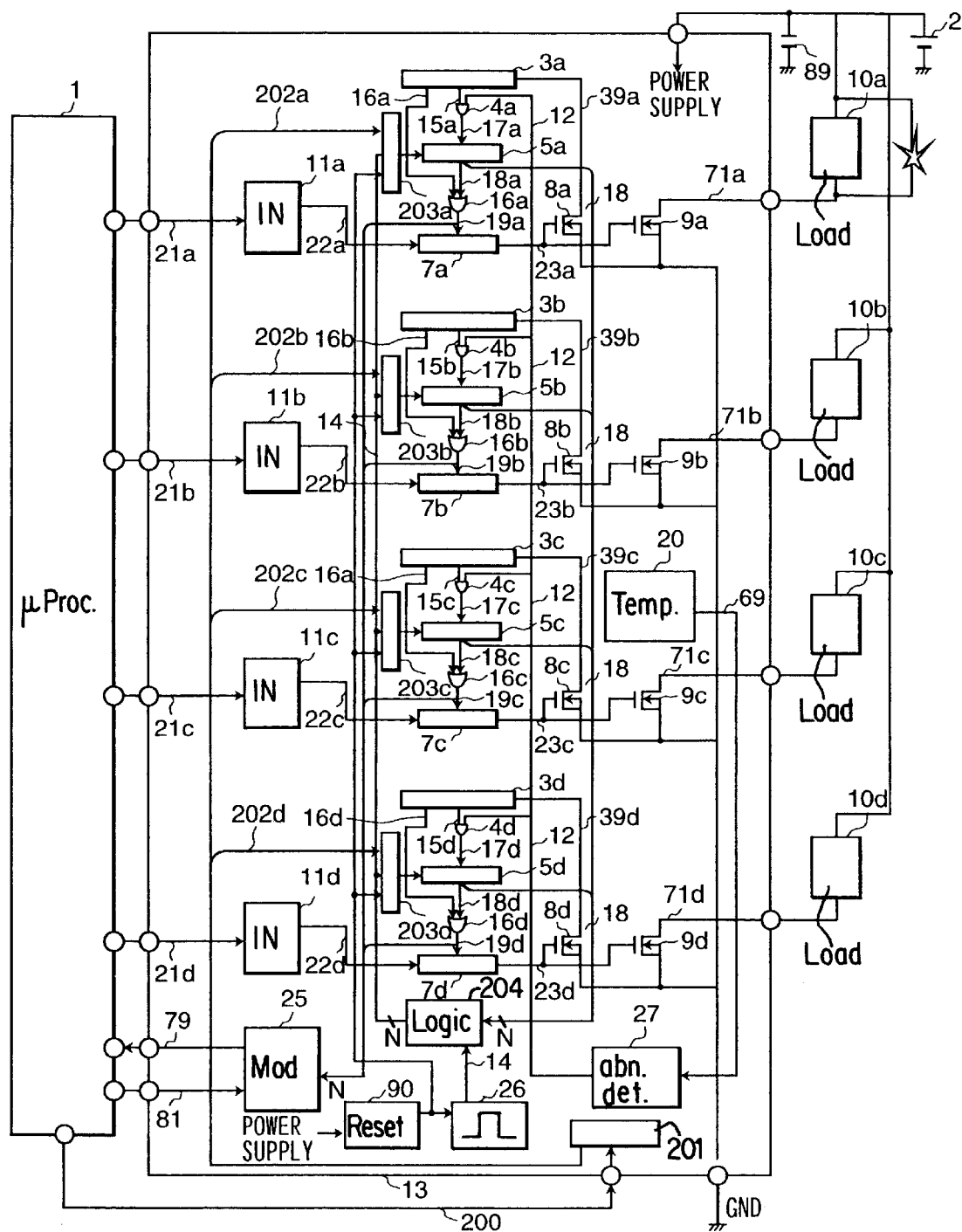
FIG. 13 is a block diagram shows another embodiment of an apparatus with over-current and over-temperature shutdown means according to the present invention.
Figure 14:
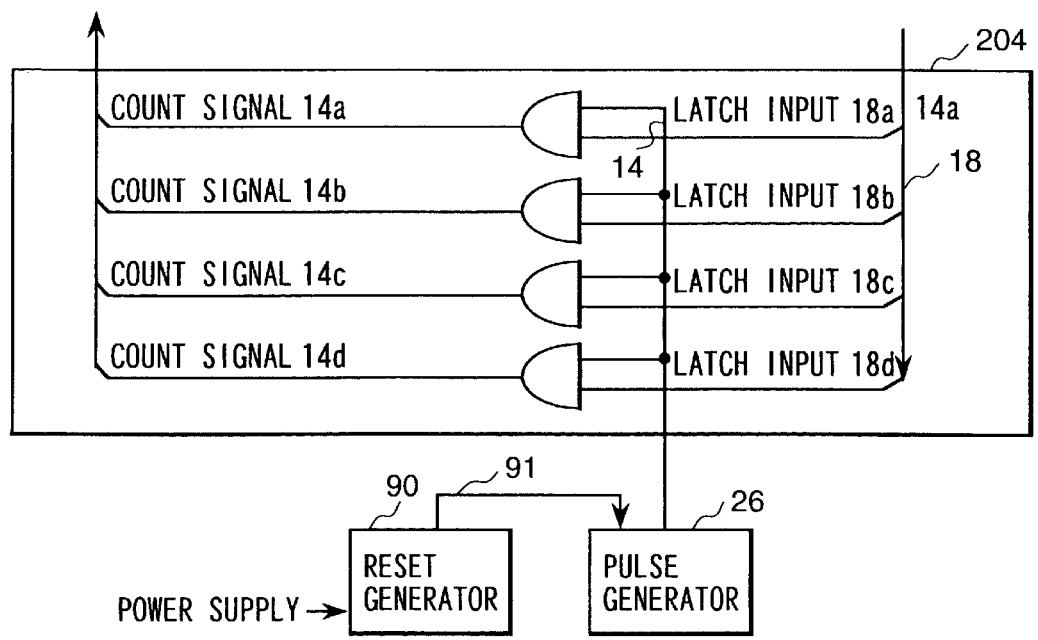
FIG. 14 is a block diagram showing the construction of an element of the apparatus shown in FIG. 13.

In FIG. 13, reference numeral 204 is a logic circuit. As shown in FIG. 14 a reset signal 91 is generated in the reset generator 90 which uses the power supply voltage. The re-return pulse 14 which is generated in the pulse generator 26 and the Q outputs 18a–18d from the latch circuit 5, cause the counter signals 14a–14d to be generated, which enable the counter circuits 203a –203d.

In addition, the reset signal 91 from the reset generator 90 is also input to the counter circuits 203a –203d. Further, reference numerals 205a–205d are clear outputs of the counter circuits 203a –203d, which clear the latch circuit to the initial condition. Reference numeral 201 is a memory which stores the value of the establishment signal 200 received from an outside component, and generates the establishment signals 202a–202d. The latter signals, which show the establishment values, are outputted to the counter circuits 203a –203d.

Except for the above, the apparatus according to this second embodiment of the present invention is similar to that of the first embodiment.

Next, the operations of this second embodiment according to the present invention will be explained referring to FIG. 14 and FIG. 15.

FIG. 14 shows the details of the logic circuit 204 of this second embodiment of the invention. The re-return pulse 14 from the pulse generator 26 is input to "AND" gates, together with the Q output 18a from the latch circuits 5a–5d, generating the counter signals 14a–14d. Thus, the counter signals 14a–14d are outputted only if the latch circuits 5a–5d are set and the Q outputs 18a–18d is "HIGH".

Figure 15:
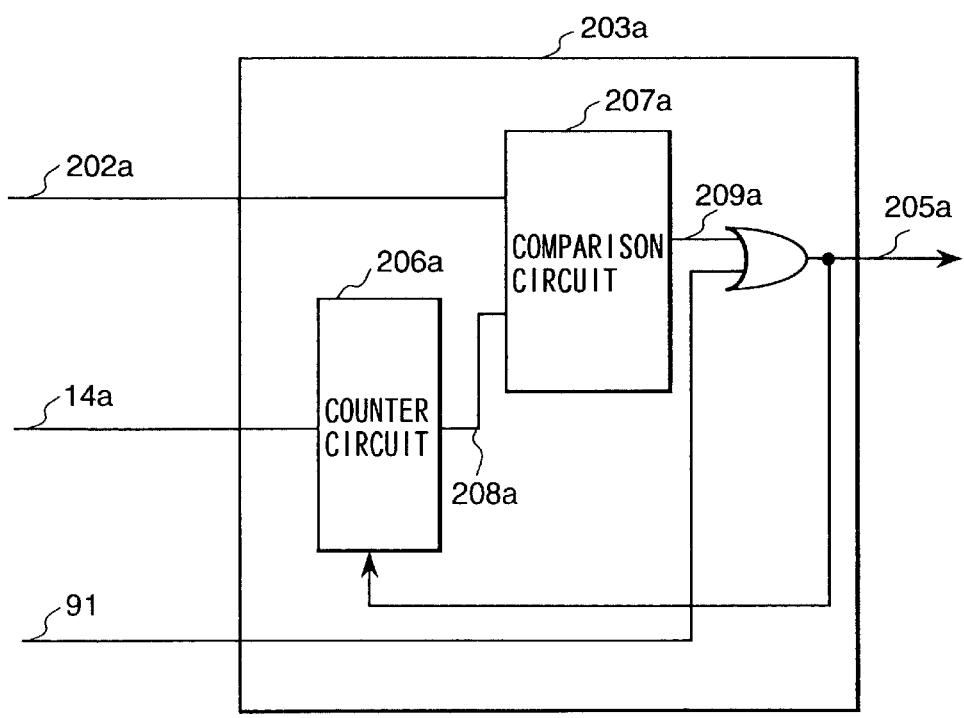
FIG. 15 is a block diagram showing the construction of another element of the apparatus shown in FIG. 13.

FIG. 15 shows the details of the counter 203a. In FIG. 15, reference numeral 202a is an establishment signal which is received from an outside component, reference numeral 206a is an up-counter which counts up in response to the counter signal 14a, and reference numeral 207 is a comparison circuit. The comparison circuit 207 compares the establishment signal 202a with a count value 208a from the up-counter 206a, and when they coincide the coincidence signal 209 is outputted. The latter signal is presented to an OR gate together with a reset signal 91 from the reset generator 90, and a clear signal 205 is outputted.

When the power supply has risen, the clear signal 205, responsive to the reset signal 91, causes the latch circuit 5a to be reset to its initial condition, even when the counter value 208a and the establishment signal 202a coincide.

Further, when the counter value 208a and the establishment signal 202a coincide, the clear signal 205A is inputted to the up-counter 206a and the counter value is reset to zero.

The effects of this second embodiment of the invention are as follows.

When an over-current flows to the switch power element 9a due to a short-circuit of the load 10a, in response to the over-current and the over-temperature detection as stated above, the Q output of latch circuit 5a is also inputted to the logic circuit 204, where the AND gate (FIG. 14) is opened and the counter signal 14a is outputted.

As with the re-return pulse generated by the pulse generator 26, the period of the counter signal 14a is T1. The latter signal is input to the counter 203a, and is counted by the up-counter 206a. When the count value 208a coincides with the establishment value 202a, a clear output 205a is generated, and the latch circuit 5a is cleared.

As a result, after to the latch circuit is set to "HIGH", and after the predetermined period T1×the counter value, the latch is cleared, in response to correspondence of the establishment value to the input establishment signal 202a. After the abnormality is overcome, it can establish freely the re-return time from the set of the latch to the re-return of the latch.

Further, by virtue of the AND gate in the logic circuit 204, since the counter signal 14 is outputted, only when "HIGH" is set in the latch circuit 5a the up-counter 206a is counted up only when the abnormality is overcome. As a result, for every latch circuit 5a–5d, since the time from the setting of the latch to the reset of the latch can be set, return time control can be carried out in response to the kinds of the loads. Further, with respect to the up-counter 206a shown in FIG. 15, for example the construction where the output 18a of the latch circuit 15a is input as the reset signal of the up-counter 206a can be employed, then a desirable operation can be realized.

With this construction, when the Q output of the latch circuit is set to "HIGH", it counts up; and when it is cleared to "LOW", it is reset to the initial condition, as above stated. Thus, for every switch power elements 9a–9d, the time from setting of the latch to the reset thereof is established individually; as a result return time control can be carried out in response to the kinds of the loads.

Next, a further embodiment of an apparatus with an over-current shutdown means and an over-temperature shutdown means according to the present invention will be explained referring to FIG. 16.

Figure 16:
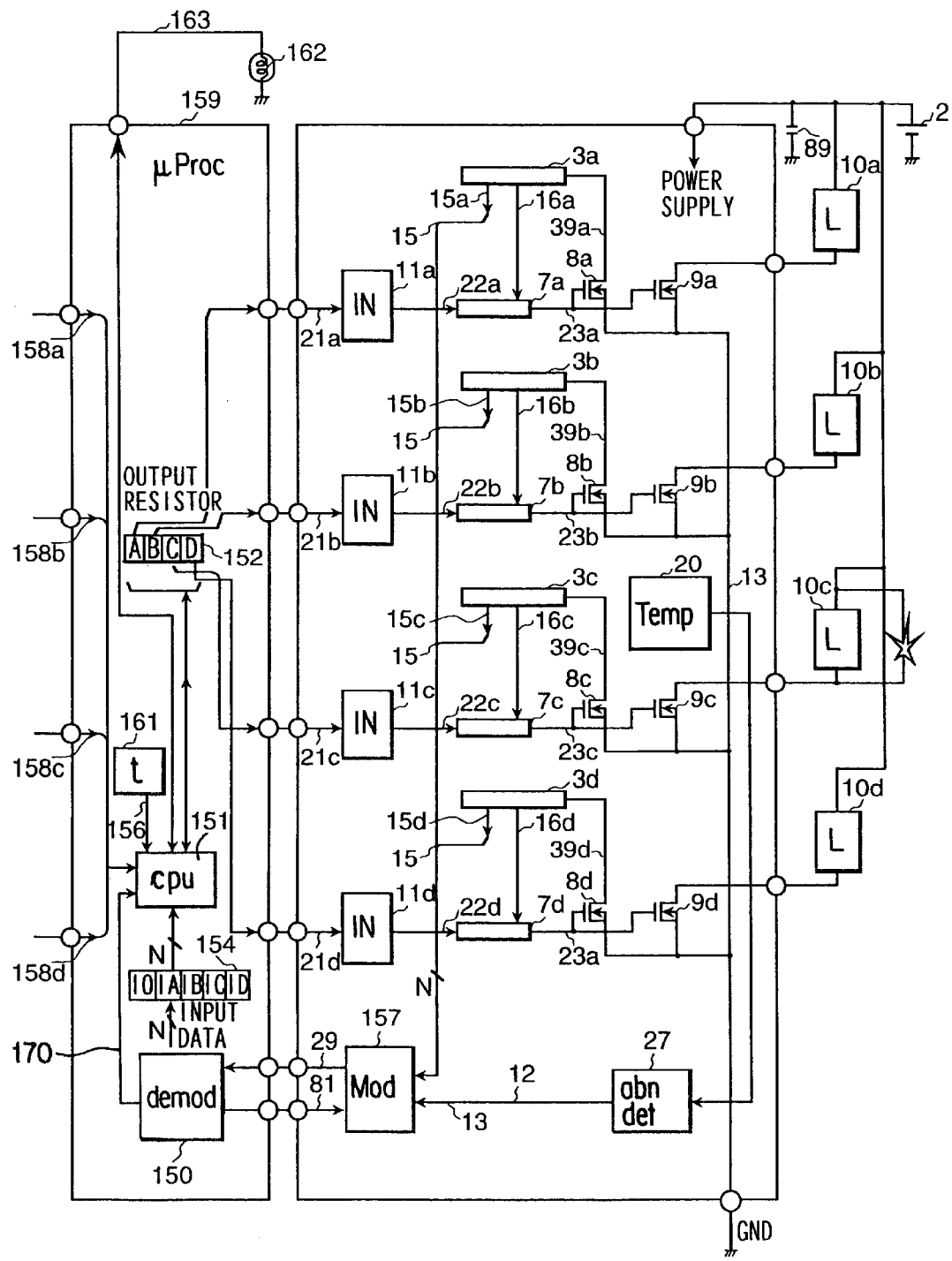
FIG. 16 is a block diagram showing another embodiment of an apparatus with over-current and over-temperature shutdown means according to the present invention.

In FIG. 16, a reference numeral 159 is microprocessor, reference numeral 151 is a central processing unit, reference numeral 152 is an output resistor, reference numeral 154 is an input resistor, and reference numeral 150 is a communication demodulator. Reference numeral 157 is a communication use modulator, reference numerals 158a14 158s are input pin commands, reference numeral 161 is a timer, reference numeral 156 is a timer interruption signal, reference numeral 170 is a communication use interruption signal, reference numeral 162 is an over-current condition display lamp, and a reference numeral 81 is a communication clock.

In addition to the above, the elements which are common to the former embodiment of the invention bear the same reference numerals. In the above stated further embodiment a part of the automatic shutdown operations which are based on the detection signals of the over-temperature abnormality and the over-current abnormality is arranged to be processed by an outside portion of the microprocessor 159.

However in this embodiment, almost all of the controls of these protection operations are completed in the microprocessor 159. Namely, the temperature abnormality detection signal 12 and the over-current detection signals 15a–15d having N bits are modulated by the communication use modulator 157, and are demodulated by the communication use demodulator 150 which receives the over-current detection signals 15a–15d.

Further, by these demodulation results and the establishment the output resistor 152 from the input commands 158a–158d, the signal is outputted to the output ports. This processing is carried out in the central processing unit 151 and the interruption signals 156 and 159 from the timer 161 and the communication use demodulator 150 are prepared as a trigger signal of the processing start. Further, a routine for monitoring the conditions of the input pin commands can be provided in the main program.

Figure 17:
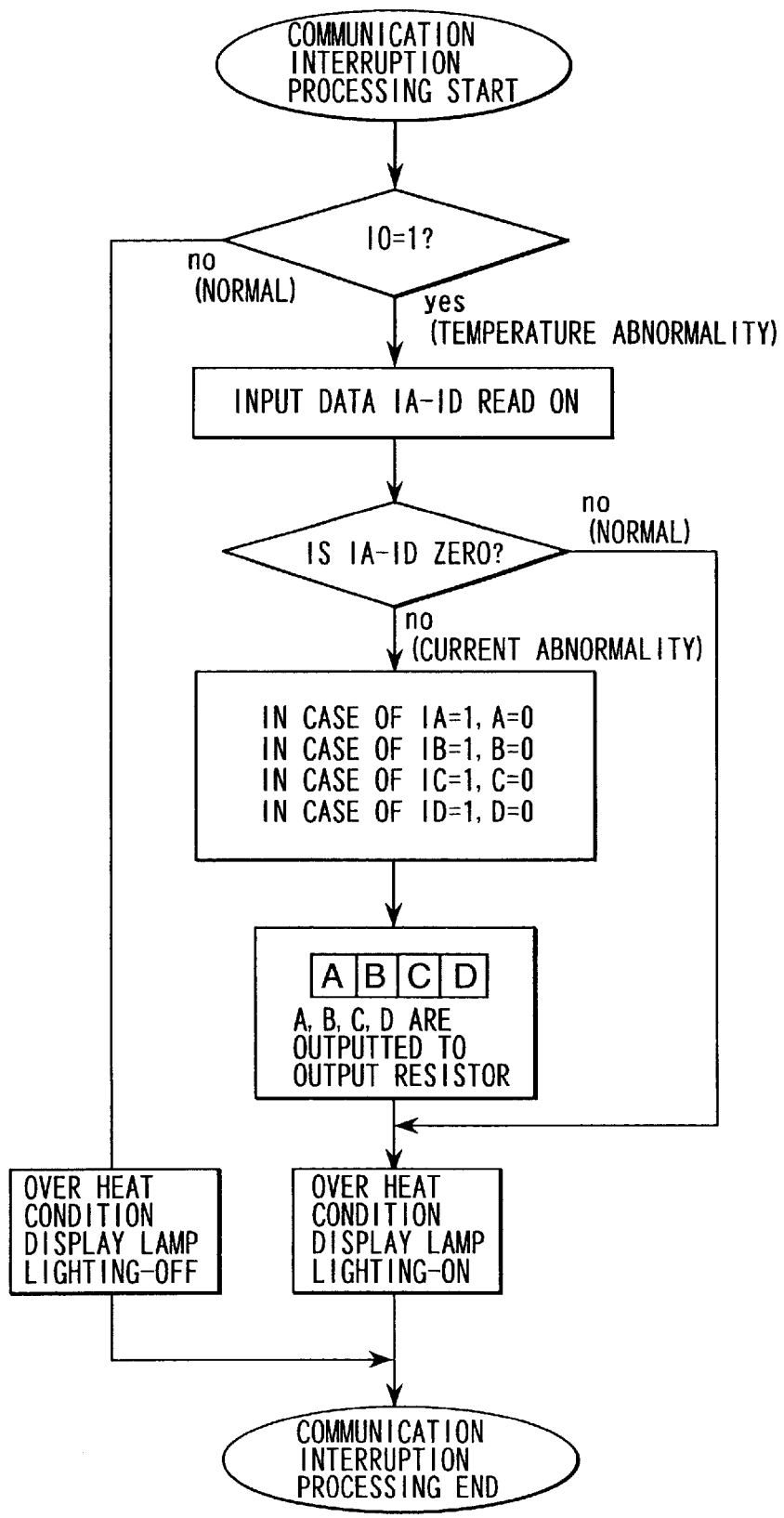
FIG. 17 is a processing flow chart of a microprocessor of the apparatus shown in FIG. 16.

These examples of the processing will be explained by reference to FIG. 17 to FIG. 19. Further, such processing generally can be extended in the system having N bits; however to simplify, an example of processing having 4 bits will be explained. Herein, the respective bits of the output resistor are indicated as A, B, C and D; a bit for exhibiting a temperature abnormality is indicated as IO; and the respective bits are indicated as IA, IB, IC and ID.

Further, the initial reset signal is input to the microprocessor from a set signal generation circuit (not shown). With this construction, the output resistor and the respective numerals comprised of ka, kb, kc and kd etc. (described later) are set to zero.

In a case where the short-circuit condition of the load continues (continuity testing is continued indefinitely) due to the deterioration of the switch power element, the above stated respective numerals are the count which has prepared to come to an end by a suitable time number (M). This can be implemented using a memory element of the microprocessor. (It is possible to install it in an external component.) In this further embodiment of the apparatus with the over-current shutdown means and the over-temperature shutdown means according to the present invention, it is named as a testing time number counter value.

Further, serial communication (signals arranged in sequence on a time axis) is carried out between the communication modulator 157 and demodulator. A clock for this purpose is supplied from the microprocessor 159 over a line 81. It also synchronizes the signals comprised of IA, IB, IC and ID etc. which are returned to the microprocessor 159 through a communication signal line 29. Further, a counter value in the timer 161 is established to count the above stated time T1, and to output an interruption pulse having the period T1. That is, an interval T1 for repeating the continuity testing is established using the timer 161.

In this embodiment the period of a clock 81 causes the communication to be carried out at a timing that is much shorter than the period of the timer interruption signal, namely at a fully rapid speed. Further, at the same time, the over-temperature and over-current abnormality signals are transmitted to the microprocessor at the fully rapid speed. When this speed is not fully rapid, then the switch power element is maintained continuously in a continuity state in an overheated condition, and will be destroyed.

With the construction of this embodiment of the invention, when the sufficient communication speed cannot be obtained, it is necessary to take countermeasures in which the information of the respective bits is communicated using a multi-pin parallel line transmission, for example. In this figure, the operation of the over-current detection circuits 3a–3d is similar to that of the embodiment shown in FIG. 1; and the over-current detection circuits are shut down automatically through the signals 16a–16d at the over-current condition and then the current is limited.

Hereinafter, communication interruption processing will be explained referring to the processing flow shown in FIG. 17. A central processing unit 151 in the microprocessor 159 receives a sequence of serial data, and then every unit each receives an interruption processing element since in the unit information bit 10 which indicates a temperature abnormality is included, first of all that bit is checked. If it has not risen, to relieve the over heat condition, a signal 163 shown in FIG. 16 is inactivated and a lamp 162 is turned off. On the other hand, when the bit has risen, it is supposed to indicate the existence of an over- temperature condition, the signal lines IA–ID are checked further.

As stated above, with the over-temperature information, it is possible to monitor the temperature of the portion on which the chip is mounted. However, since it is impossible to specify which switch power element is experiencing the over heat condition, the over-current condition is also checked. For the signal lines IA–ID, the bits A–D which corresponds to those where a "1" has appeared are dropped down to "0"; that is, the bit is replaced by the shutdown signal. In the case of the bits where a "1" has not appeared, the former condition is held, and no processing is carried out. Finally, a lamp which shows the over heat condition is illuminated.

As a result, in accordance with the abnormality signals of both over-temperature and over-current, processing for promoting the shutdown is performed frequently, when each series of the communications is carried out. On the other hand, the operation for preserving the continuity is the time of started at a change (in particular a change from "HIGH" to "LOW": a change between the shutdown command and the light-on command) of the input pin commands 158a–158d and under a timing of every interval T1 each.

Commonly, the frequency of this operations is much smaller than the above stated communication interruption. Hereinafter, these processing will be explained referring to processing flow charts shown in FIG. 18 and FIG. 19.

Figure 18:
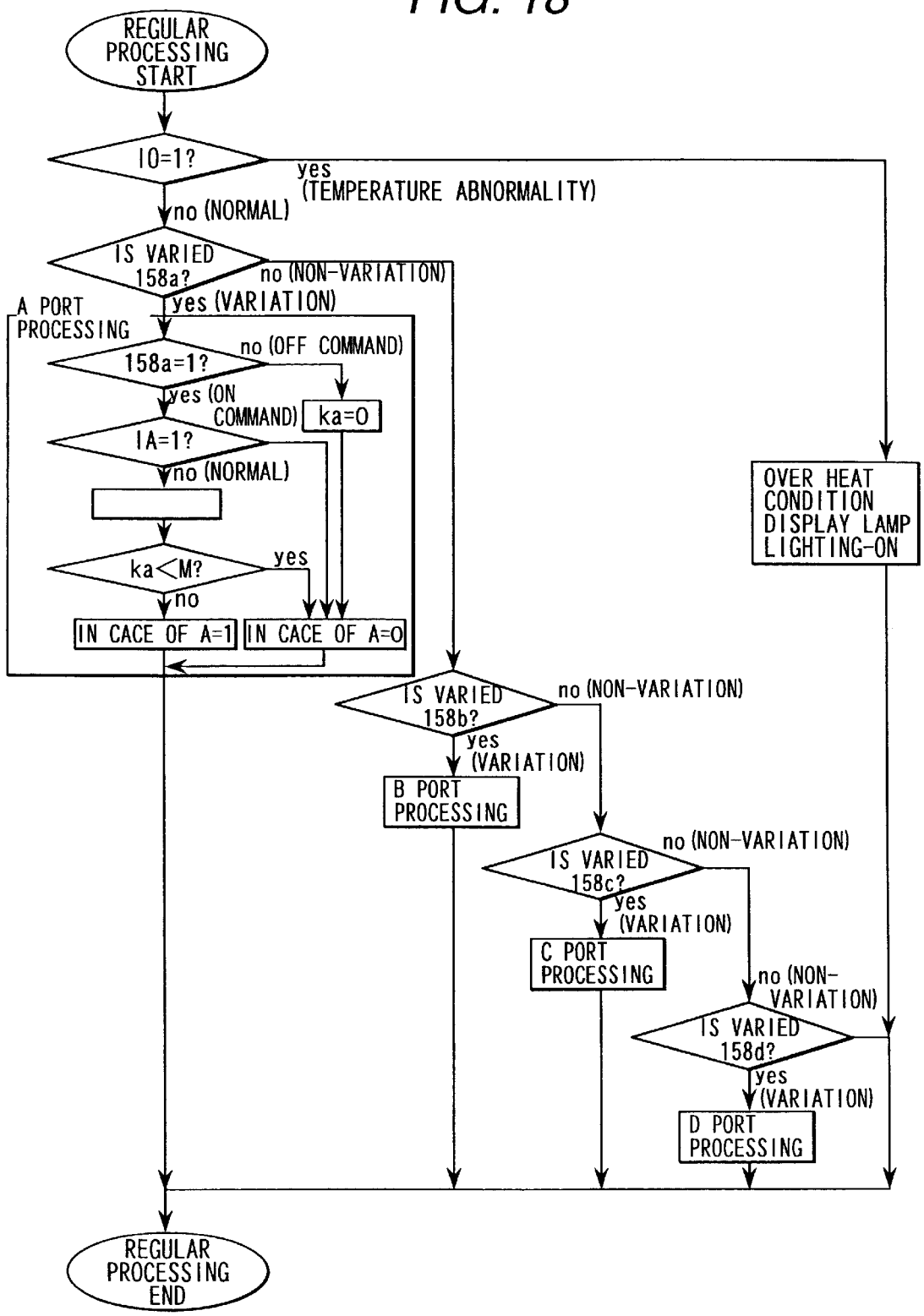
FIG. 18 is a processing flow chart of another microprocessor of the apparatus shown in FIG. 16.
Figure 19:
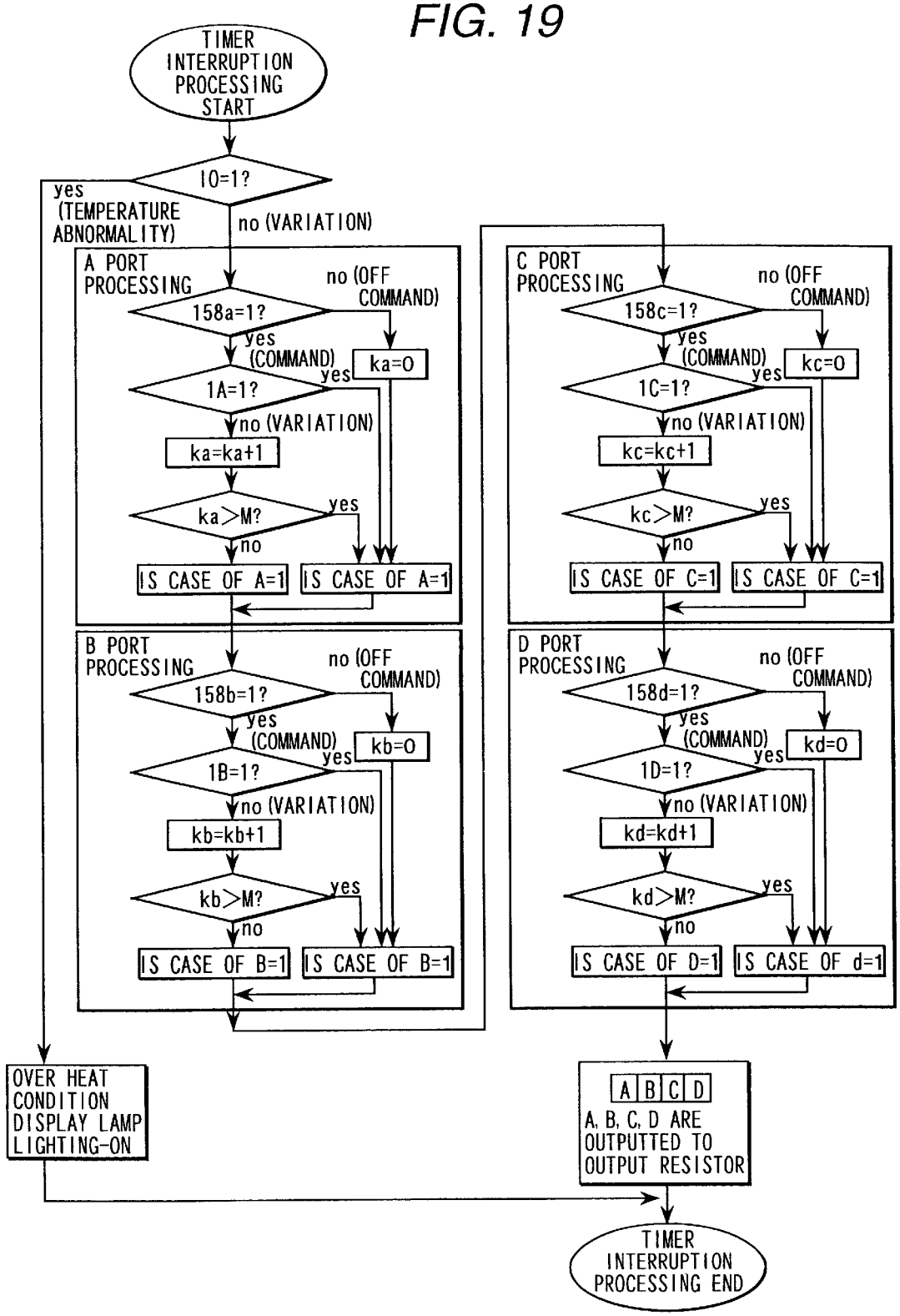
FIG. 19 is a processing flow chart of a further microprocessor the apparatus shown in FIG. 16.

First of all, a processing example for detecting the change in the input pin commands 158a–159d is shown in FIG. 18. Commonly a pin condition is stored in the memory, and whether the pin condition is changed or not is monitored according to a main routine or a routine having high generation frequency. At this time, when the input pin command 158a is changed from "LOW" to "HIGH", the testing time number counter value ka is checked, and is reset to zero, the "LOW" condition and the initial condition.

As a result, the pin command is incremented so that ka=1 with a timing for promoting the continuity start. M is set to an integer which is not large (commonly about 5–10) to regulate the continuity testing time number. Commonly, since the bit IO becomes "LOW", according to this routine, when the input pin command is changed to "HIGH", any of bits A–D which corresponds to the changed pin is set to "1". After that according to the above stated communication interruption processing routine, the operation is transferred to automatic shutdown operation only when the over-temperature and the over-current are detected.

Further, next referring to FIG. 19, the timer interruption processing routine will be explained. Processing in this routine is basically similar to that shown in FIG. 18. However, a trigger in this routine is a timer interruption signal which has a period Tl. Herein, the pin commands 158a–158d and the testing time number counter values (ka, kb, kc, and kd) are checked, and the bits (A–D) which corresponds to the continuity command is arisen "1". In this case, when the testing time exceeds the above stated number M, "0" is inserted. The testing time number counter values (ka, kb, kc, and kd) are reset zero when the pin command signal is "0" ("LOW"), so that it is prepared to count the testing time number to the next continuity command.

Hereinafter, the operation of the embodiment of FIG. 16 will be explained, referring to an essential waveform view shown in FIG. 20.

Figure 20:
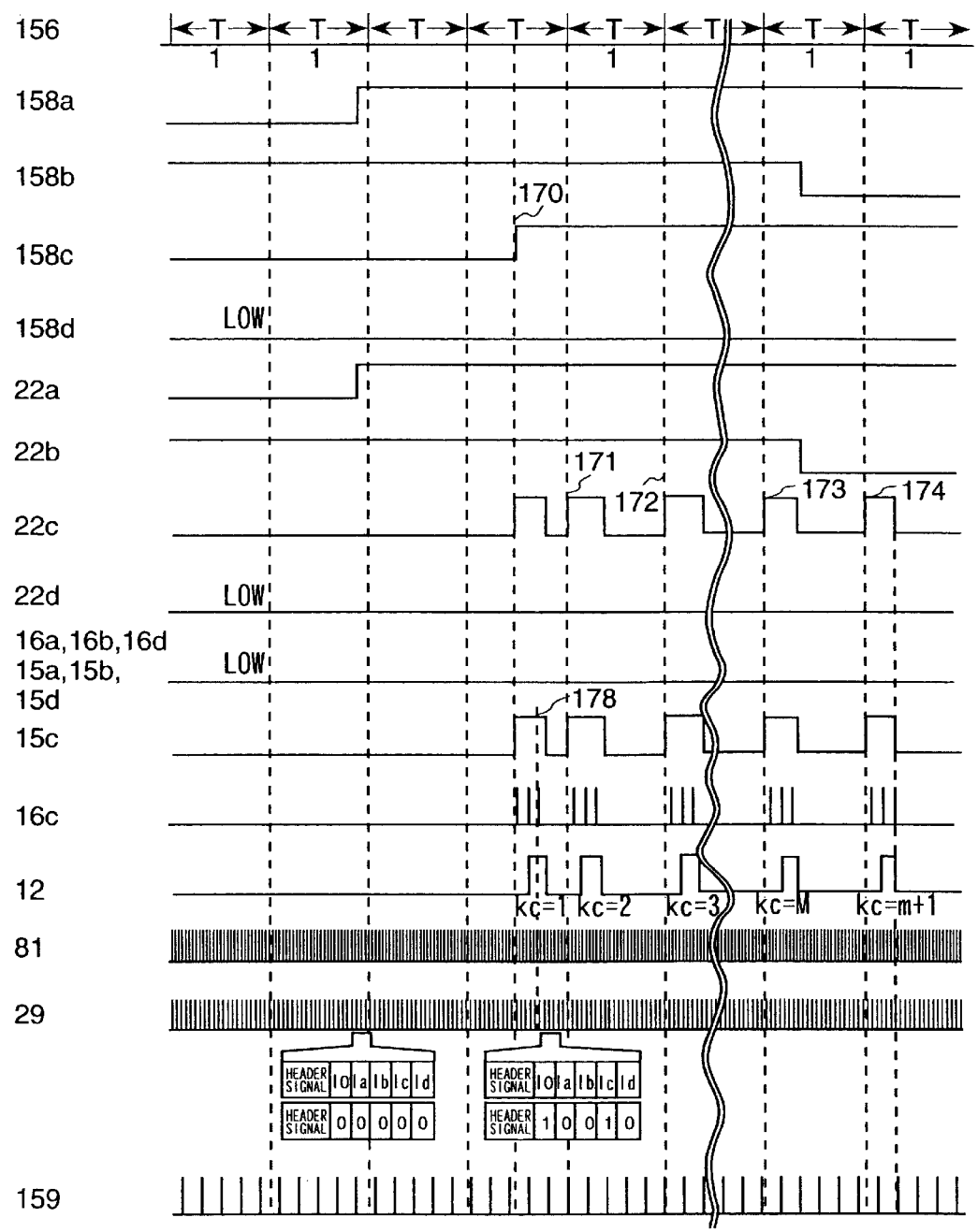
FIG. 20 illustrates waveforms for explaining the operation of the apparatus shown in FIG. 16.

In FIG. 20, reference numerals 170–176 indicate time points; and in this embodiment it is assumed that a short-circuit is generated at both ends of the load 10c shown in FIG. 16. Further, the input pin commands are as shown reference numerals 158a–158d of FIG. 16 and a period of the timer interruption is indicated by T1. It is assumed that the timer interruption is generated in response to a rising pulse of the waveform 156. Further, it is assumed that the change of the pin command signal is monitored with a fully short period according to the processing routine shown in FIG. 18.

First of all, as to the input pin commands 158a, 158b and 158d, at whose load terminals no abnormality exists, the common continuity and shutdown command are transmitted as the input signals 22a, 22b, 22d. On the other hand, at the input pin command 158c, at a time point 170, a change from "LOW" to "HIGH" is detected according to the processing routine, and to the input signal 22c it changes as the continuity signal. When the input signal 22c is changed to "HIGH", the testing time number count value kc is incremented to "I". At this time, since the load 10c is short-circuited, at the over-current detection circuit 3c (FIG. 16) the input signal 15c becomes "HIGH" (the high potential) signal.

The communication signal 29 is shown before and after of this fact. Before a time point 170 no abnormality of either the over-temperature or the over-current is detected. The above stated condition is shown enlarged in a lower portion of the communication signal. That is, by synchronizing with a clock 81, all the series of bits Io, IA, IB, IC and ID which continue from a header portion are zero. However, at the time point 170 when it lapses, the over-current detection signal 15c is changed to "1" and in succession the over-temperature detection signal is changed to "1". Of course, at this time, since the above stated current limit operation is being performed, the signal 16c repeats the reverse operation between the "HIGH" potential and the "LOW" potential.

Further, at last at a time 176 the communication signal 29 is appeared to rise IO and further in IC bit is appeared to rise to "1". The microprocessor which has received the signal carries out the zerofill processing of the output bit C in accordance with the communication interruption processing routine shown in FIG. 17. Accordingly , the potential of the signal 22c is changed from "HIGH" to "LOW".

Next, the signal 22c is reverts from "LOW" to "HIGH" a time 171 where the timer interruption processing signal 156 is generated. At this time, the timer interruption processing routine shown in FIG. 19 is operated and the counter value kc is set to "2" (kc=2); and two time continuity testing operation is carried out the signal 22c is made "HIGH".

At this time, when the above stated over-current abnormality and the over-temperature abnormality are generated, again the system is transferred to the automatic shutdown. The above stated series of operations are repeated until the counter value kc reaches M (kc=M); thereafter, the pin command 158a is at "HIGH" potential, the above stated series of operation is no longer repeated. In the above stated operations, an over heat condition indication lamp 162 is lit during the over-temperature detection abnormality. However, it is of course possible to replace it to a sound power, such as a buzzer.

In this embodiment according to the present invention, the time number for testing automatically the continuity is established as the counter value ka etc., for example, and is limited. However, it is also possible to realize a time limitation using a distinct timer etc.

Further, although in this embodiment the invention, only one temperature detector is provided, it is possible to provide several temperature detectors which are arranged at adjacent positions, one block each, when there are many switch power elements which are dispersed at several portions in the chip by blocking the switch power elements. As stated above, the present invention can be carried out using a microprocessor.

Further, the respective embodiments of the present invention can be realized both in the form of hardware, and in software. In the latter case, the software is run by a high function execution apparatus such as a microcomputer exemplified in a latter portion. In the explanation stated in above, the element 65a is realized as an element for a temperature detection use by a multi-stage serial connection of a common diode. Since a comparatively large current must flow to a portion corresponding to the switch power elements 9a–9d, such a portion occupies a comparatively large area on the chip.

Figure 21:
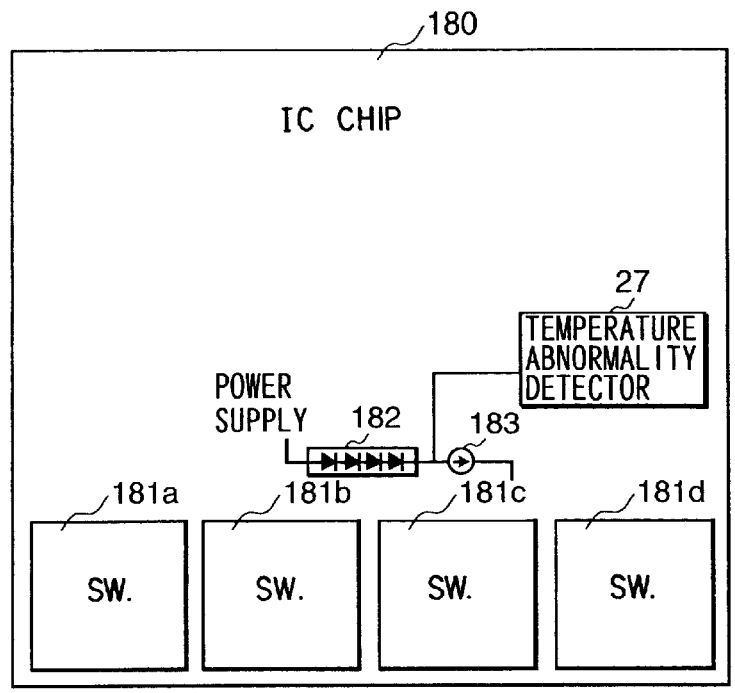
FIG. 21 is a view showing a chip for explaining an element of the apparatus with an over-current shutdown means and an over-temperature shutdown means of one embodiment according to the present invention.

Now when it is supposed that this area is about 40%, the state is as shown in FIG. 21. In this figure, reference numeral 180 is an integrated circuit chip, reference numerals 181a–181d are the switch power chips, reference numerals 182 is a multi-stage diode, and reference numeral 183 is a constant current circuit which is arranged on the chip.

The multi-stage diode 182 is arranged to detect the heat generation of the switch power element block, however in the prior technique, such an arrangement is not referred to. Herein, an example in which the multi-stage diode 182 can monitor the thermal behavior of the respective switch power elements will be disclosed hereinafter.

Figure 22:
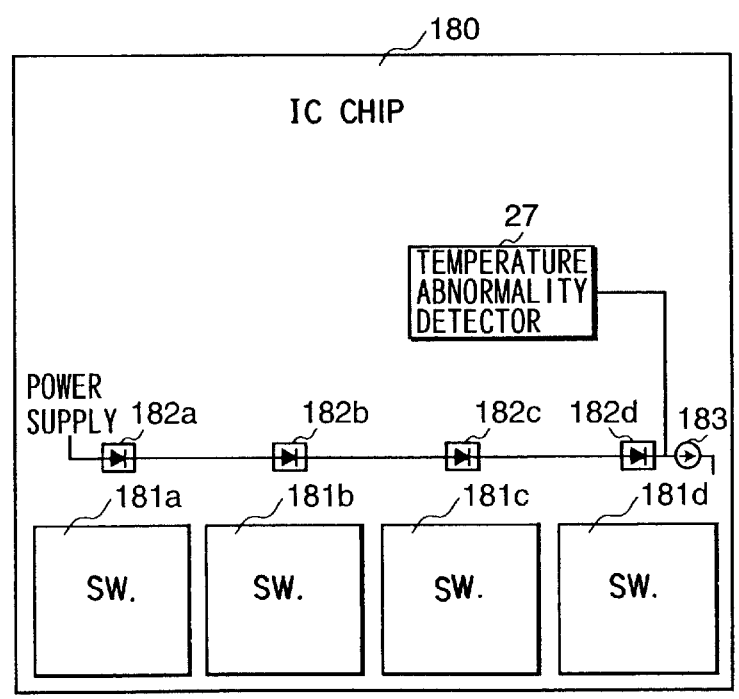
FIG. 22 is a view showing a chip for explaining an element of the apparatus with an over-current shutdown means and an over-temperature shutdown means of another embodiment according to the present invention.

FIG. 22 shows an embodiment according to the present invention in which from the aspect of this point the present invention is devised. The respective stages of the multi-stage diode 182 is disposed at the stages comprised of 182a–182d and is arranged adjacently to the respective switch power element chip.

These stages are connected in series to a wiring comprised of an aluminum etc. on the chip and is current driven by a constant current power supply 183: By the monitoring the potential of the multi-stage diode terminal according to the temperature abnormality detector 27, it is possible to monitor equally the switch power element chip.

Figure 23:
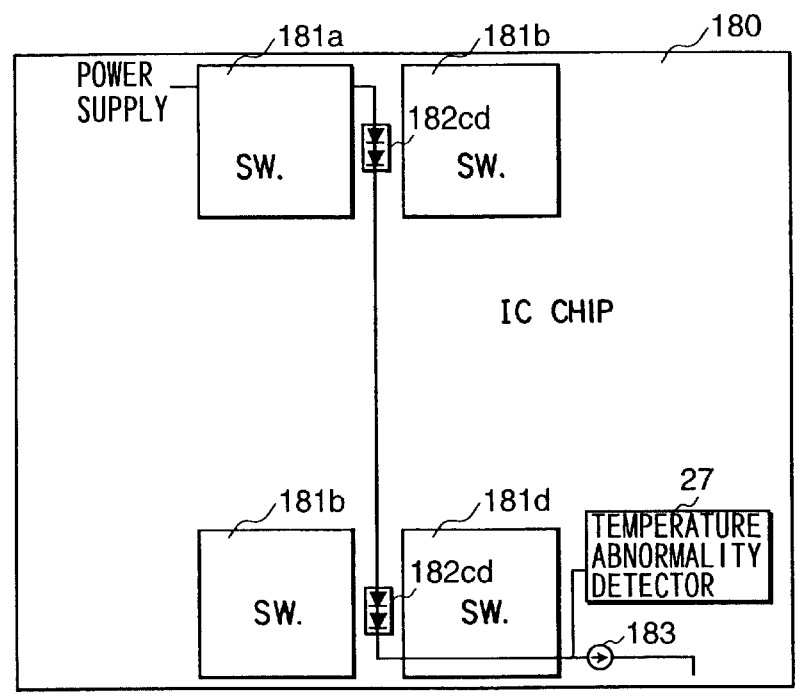
FIG. 23 is a view showing a chip for explaining an element of the apparatus with an over-current shutdown means and an over-temperature shutdown means of a further embodiment according to the present invention.
Figure 24:
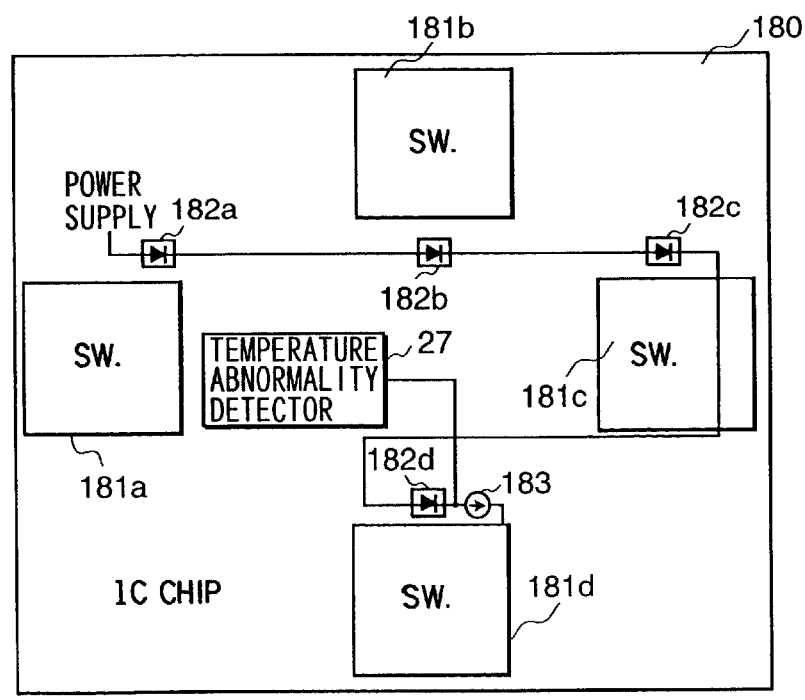
FIG. 24 is a view showing a chip for explaining an element of the apparatus with an over-current shutdown means and an over-temperature shutdown means of a further more embodiment according to the present invention.

The switch power element chip is not to limited to be arranged along a single side of the integrated chip rather, as shown in FIG. 23 and FIG. 24, the switch power elements can be arranged in two or more portions. However, if the multistage diode is spaced equally to the block number, it is possible to perform equally the temperature monitoring of the respective blocks. Herein, a reference numeral 182ab is a diode and a reference numeral 182cd is a diode, respectively.

According to the present invention, the over-temperature protection function, which has a somewhat slow reaction but can detect surely the abnormality, is compatible with the over-current shutdown means, and the power element which undergoes an abnormality can be specified and protected by means of simple circuit construction and with the low cost.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An apparatus with an over-current shutdown means and an over-temperature shutdown means, comprising:
    a power element for maintaining operating continuity or causing a shutdown of a power supply to a load which is mounted on a vehicle;
    a current detection means for detecting a value of a current which flows in said power element;
    a current-voltage converting means for converting said detected current value to a voltage signal;
    a temperature detection means for detecting a quantity of heat generated by said power element and for varying one of said voltage signal and said current value in response to said quantity of heat generated by said power element;
    a latch means for maintaining a predetermined condition of said power element in response to an output from said current detection means and said temperature detection means;
    a return pulse generator for generating a return pulse so as to return said latch means to an initial condition; and
    a continuity and shutdown control means for maintaining said operating continuity or causing a shutdown of said power element in response to said output of said latch means.

2. An apparatus with an over-current shutdown means and an over-temperature shutdown means according to claim 1, wherein
    during a period in which said latch means is set to a predetermined condition, said continuity and shutdown control means is controlled in response to an output of said current detection means.

3. An apparatus with an over-current shutdown means and an over-temperature shutdown means according to claim 1, further comprising a reset generation means for resetting said return pulse generator for returning said latch means to an initial condition.

4. An apparatus with an over-current shutdown means and an over-temperature shutdown means according to claim 1, further comprising a variation means for varying a duration of said return pulse.

5. An apparatus with an over-current shutdown means and an over-temperature shutdown means according to claim 1, further comprising a limitation means for limiting an output of said return pulse in response to an output of said latch means.

6. An apparatus with an over-current shutdown means and an over-temperature shutdown means according to claim 1, further comprising:
    a count means for counting a length of said return pulse; and
    a comparison means for comparing an output from said count means with a count threshold value which is established to have a predetermined value.

7. An apparatus with an over-current shutdown means and an over-temperature shutdown means according to claim 6, wherein p1 said count means is reset to an initial condition according to a circuit output of said latch means.

8. An apparatus with an over-current shutdown means and an over-temperature shutdown means, comprising:
    plural power elements for maintaining operating continuity or causing a shutdown of a power supply to respective plural loads which are mounted on a vehicle;
    plural current detection means for detecting values of a current which flows in each of said respective power elements;
    plural current-voltage converting means for converting said detected current value to a voltage signal;
    a temperature detection means for detecting a quantity of heat generated by respective ones of said power elements, and for varying one of said voltage signal and said current value in response to said quantity of heat generated by said respective power elements;
    plural latch means for maintaining a predetermined condition of said respective power elements in response to an output from said plural current detection means and said temperature detection means;
    a return pulse generator for generating a return pulse so as to return said plural latch means to an initial condition; and
    a continuity and shutdown control means for maintaining said operating continuity or causing a shutdown of said respective power elements in response to said output of said plural latch means.

9. An apparatus with an over-current shutdown means and an over-temperature shutdown means according to claim 8, wherein
    said current detection means establish plural detection threshold values for detecting said values of said current which flows into said power element.

10. An apparatus with an over-current shutdown means and an over-temperature shutdown means, comprising:
    a power element for maintaining operating continuity or causing a shutdown of a power supply to a load which is mounted on a vehicle;
    a current detection means for detecting a value of a current which flows in said power element;
    a current-voltage conversion means for converting said detected current value to a voltage signal;
    a temperature detection means for detecting a quantity of heat generated by said power element, and for varying one of said voltage signal and said current value in response to said quantity of heat generated by said power element;
    a latch means for maintaining a predetermined condition of said power element in response to an output from said current detection means and said temperature detection means;
    a return pulse input terminal means for inputting a return pulse so as to return said latch means to an initial condition; and
    a continuity and shutdown control means for maintaining said operating continuity or causing a shutdown of said power element in response to said output of said latch means.

11. An apparatus with an over-current shutdown means and an over-temperature shutdown means, comprising:
    plural power elements for maintaining operating continuity or causing a shutdown of a power supply to respective plural loads which are mounted on a vehicle;

plural current detection means for detecting values of a current which flows in each of said respective power elements;

plural current-voltage conversion means for converting said detected current value to a voltage signal;

a temperature detection means for detecting a quantity of heat generated by respective ones of said power elements, and for varying one of said voltage signal and said current value in response to said quantity of heat generated by said respective power elements;

plural latch means for maintaining a predetermined condition of said respective power elements in response to an output from said plural current detection means and said temperature detection means;

a return pulse input terminal means for inputting a return pulse so as to return said plural latch means to an initial condition; and plural continuity and shutdown control means for maintaining said operating continuity or causing a shutdown of said respective power elements in response to said output of said plural latch means.

12. An apparatus with an over-current shutdown means and an over-temperature shutdown means, comprising:

plural power elements for maintaining operating continuity or causing a shutdown of a power supply to respective plural loads which are mounted on a vehicle;

at least one current detection means for detecting an amount of current which flows in respective ones of said power elements;

at least one current-voltage conversion means for converting said detected current amount to a voltage signal;

a temperature detection means having a diode which is connected in series and varies a terminal voltage in response to an amount of heat generated by respective ones of said power elements;

a microprocessor for outputting a predetermined control signal to the respective power elements in response to an output from said current detection means and said temperature detection means; and at least one continuity and shutdown control means for maintaining operating continuity or causing a shutdown of said power element in response to said output of said microprocessor.

13. An apparatus with an over-current shutdown means and an over-temperature shutdown means, comprising:

at least one power element for maintaining operating continuity or causing a shutdown of a power supply to plural loads which are mounted on a vehicle;

at least one current detection means for detecting an amount of current which flows in each of said at least one power element;

at least one current-voltage converting means for converting said detected current amount to a voltage signal;

a temperature detection means having a diode which is connected in series and varies a terminal voltage in response to an amount of heat generated by each of said at least one power element;

at least one latch means for maintaining a predetermined condition of each of said at least one power element in response to outputs from said current detection means and said temperature detection means;

a microprocessor for inputting a return pulse so as to return said latch means to an initial condition; and at least one continuity and shutdown control means for maintaining operating continuity or causing a shutdown control of each of said at least one power element in response to said output of said microprocessor.

14. An apparatus with an over-current shutdown means and an over-temperature shutdown means, comprising:

at least one power element for maintaining operating continuity or causing a shutdown of a power supply to plural loads which are mounted on a vehicle;

at least one current detection means for detecting an amount of current which flows in each of said at least one power element;

at least one current limitation means for limiting a current amount which flows in each of said at least one power element;

at least one over-current detection means for detecting an over-current in each of said at least one power element;

a temperature detection means having a diode which is connected in series and varies a terminal voltage in response to a heat generation amount of said power element;

at least one latch means for maintaining a predetermined condition of each of said at least one power element in response to an output from said current detection means and said temperature detection means;

a microprocessor for inputting a return pulse so as to return said latch means to an initial condition; and at least one continuity and shutdown control means for maintaining operating continuity or causing a shutdown of each of said at least one power element in response to said output of said microprocessor.

15. An apparatus with an over-current shutdown means and an over- temperature shutdown means, comprising:

at least one power element for maintaining operating continuity or causing a shutdown of a power supply to plural loads which are mounted on a vehicle;

at least one current detection means for detecting an amount of current which flows in each of said at least one power element;

at least one current limitation means for limiting a current which flows into each of said at least one power element each;

at least one over-current detection means for detecting an over-current in each of said at least one power element;

a temperature detection means having a diode which is connected in series and varies a terminal voltage in response to a heat generation amount of each of said at least one power element;

at least one latch means for setting a predetermined condition in each of said at least one power element according to a product signal from said current detection means and said temperature detection means;

a microprocessor for inputting a return pulse so as to return said at least one latch means at an initial condition; and at least one continuity and shutdown control means for maintaining operating continuity or causing a shutdown of each of said at least one power element in response to said output of said microprocessor.

16. An apparatus with an over-current shutdown means and an over-temperature shutdown means, comprising:

at least one power element for maintaining operating continuity or causing a shutdown of a power supply to plural loads which are mounted on a vehicle;

at least one current detection means for detecting a current amount which flows in each of said at least one power element;

at least one current limitation means for limiting a current amount which flows in each of said at least one power element;

at least one over-current detection means for detecting an over-current in each of said at least one power element;

a temperature detection means having plural diodes which are connected in series and varies a terminal voltage in response to a heat generation amount each of said at least one power element;

plural latch means for maintaining a predetermined condition in each of said at least one power element according to a product signal from said current detection means and said temperature detection means;

a microprocessor for inputting a return pulse so as to return said plural latch means to an initial condition; and at least one continuity and shutdown control means for maintaining operating continuity or causing a shutdown of said power element in response to said output of said microprocessor;

wherein said plural diodes are arranged about a vicinity of said power element.

* * * * *